(12) United States Patent
Lu et al.

(10) Patent No.: US 9,660,019 B2
(45) Date of Patent: May 23, 2017

(54) CONCENTRIC CAPACITOR STRUCTURE

(71) Applicant: TAIWAN SEMICONDUCTOR MANUFACTURING CO., LTD., Hsin-Chu (TW)

(72) Inventors: Ying-Ta Lu, Hsinchu (TW); Chi-Hsien Lin, Taichung (TW); Hsien-Yuan Liao, Hsinchu (TW); Ho-Hsiang Chen, Hsinchu (TW); Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/075,759

(22) Filed: Mar. 21, 2016

(65) Prior Publication Data
US 2016/0204191 A1 Jul. 14, 2016

Related U.S. Application Data

(60) Division of application No. 14/454,760, filed on Aug. 8, 2014, now Pat. No. 9,293,521, which is a
(Continued)

(51) Int. Cl.
*H01L 21/02* (2006.01)
*H01L 49/02* (2006.01)
(Continued)

(52) U.S. Cl.
CPC .......... *H01L 28/88* (2013.01); *H01L 23/5223* (2013.01); *H01L 27/0207* (2013.01); *H01L 28/60* (2013.01); *H01L 2924/0002* (2013.01)

(58) Field of Classification Search
CPC ......... H01L 2924/0002; H01L 2924/00; H01L 23/5223; H01L 27/0207; H01L 28/60
(Continued)

(56) References Cited

U.S. PATENT DOCUMENTS 5,317,922 A * 6/1994 Bomback .............. G01L 9/0042
29/25.41
5,391,917 A 2/1995 Gilmour et al.
(Continued)

OTHER PUBLICATIONS

Lim, C.C. et al., "Fully Symmetrical Monolithic Transformer (True 1:1) for Silicon RFIC", IEEE Transactions on Microwave Theory and Technique, Oct. 2008, 56(10):2301-2311.
(Continued)

*Primary Examiner* — Mohammed Shamsuzzaman
(74) *Attorney, Agent, or Firm* — Duane Morris LLP

(57) ABSTRACT

A concentric capacitor structure generally comprising concentric capacitors is disclosed. Each concentric capacitor comprises a first plurality of perimeter plates formed on a first layer of a substrate and a second plurality of perimeter plates formed on a second layer of the substrate. The first plurality of perimeter plates extend in a first direction and the second plurality of perimeter plates extend in a second direction different than the first direction. A first set of the first plurality of perimeter plates is electrically coupled to a first set of the second plurality of perimeter plates and a second set of the first plurality of perimeter plates is electrically coupled to a second set of the second plurality of perimeter plates. A plurality of capacitive cross-plates are formed in the first layer such that each cross-plate overlaps least two of the second plurality of perimeter plates.

13 Claims, 16 Drawing Sheets

Related U.S. Application Data continuation-in-part of application No. 13/789,825, filed on Mar. 8, 2013, now Pat. No. 9,159,718.

(51) Int. Cl.
*H01L 23/522* (2006.01)
*H01L 27/02* (2006.01)

(58) Field of Classification Search
USPC ....... 257/532, 309, 306, 415, 312, 418, 296, 257/534; 438/689, 52, 253, 240
See application file for complete search history.

(56) References Cited

U.S. PATENT DOCUMENTS

| | | | |
|---|---|---|---|
| 5,510,298 A | 4/1996 | Redwine | |
| 5,583,359 A * | 12/1996 | Ng | H01L 23/5223 257/306 |
| 5,767,001 A | 6/1998 | Bertagnolli et al. | |
| 5,978,206 A | 11/1999 | Nishimura et al. | |
| 5,998,292 A | 12/1999 | Black et al. | |
| 6,066,537 A * | 5/2000 | Poh | H01L 23/5223 257/E21.008 |
| 6,184,060 B1 | 2/2001 | Siniaguine | |
| 6,257,059 B1 | 7/2001 | Weinberg et al. | |
| 6,297,524 B1 * | 10/2001 | Vathulya | H01L 23/5223 257/296 |
| 6,322,903 B1 | 11/2001 | Siniaguine et al. | |
| 6,383,858 B1 | 5/2002 | Gupta et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine et al. | |
| 6,664,129 B2 | 12/2003 | Siniaguine et al. | |
| 6,693,361 B1 | 2/2004 | Siniaguine et al. | |
| 6,740,582 B2 | 5/2004 | Siniaguine et al. | |
| 6,743,671 B2 | 6/2004 | Hu et al. | |
| 6,765,778 B1 | 7/2004 | Du et al. | |
| 6,784,050 B1 | 8/2004 | Aram et al. | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,072,169 B2 * | 7/2006 | Hayashi | H01G 4/30 361/303 |
| 7,102,557 B1 | 9/2006 | Frith | |
| 7,111,149 B2 | 9/2006 | Ellert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,290,449 B2 | 11/2007 | Ao | |
| 7,297,574 B2 | 11/2007 | Thomas et al. | |
| 7,335,956 B2 | 2/2008 | Chen et al. | |
| 7,335,972 B2 | 2/2008 | Chanchani | |
| 7,355,273 B2 | 4/2008 | Jackson et al. | |
| 7,485,912 B2 | 2/2009 | Wang | |
| 7,639,474 B1 * | 12/2009 | Chen | H01G 4/228 361/301.4 |
| 8,198,937 B1 | 6/2012 | Vilas Boas et al. | |
| 8,675,368 B2 * | 3/2014 | Cho | H01L 23/5223 257/531 |
| 8,759,893 B2 * | 6/2014 | Cho | H01L 23/5223 257/277 |
| 8,791,784 B2 * | 7/2014 | Cho | H01L 23/5223 336/200 |
| 8,836,078 B2 * | 9/2014 | Cho | H01L 23/5223 257/531 |
| 2003/0063026 A1 | 4/2003 | Nandy | |
| 2003/0089941 A1 * | 5/2003 | Baker | G11C 5/04 257/309 |
| 2003/0183008 A1 * | 10/2003 | Bang | B81C 1/0019 73/514.01 |
| 2003/0183864 A1 | 10/2003 | Miyazawa | |
| 2003/0218473 A1 * | 11/2003 | Yamashita | G01R 31/312 324/750.3 |
| 2004/0182158 A1 | 9/2004 | Tsubaki | |
| 2005/0167702 A1 | 8/2005 | Booth et al. | |
| 2005/0274181 A1 | 12/2005 | Kutsuna et al. | |
| 2007/0126078 A1 | 6/2007 | Huang et al. | |
| 2007/0296013 A1 | 12/2007 | Chang et al. | |
| 2008/0094149 A1 * | 4/2008 | Brobston | H03H 7/40 333/17.3 |
| 2009/0067116 A1 * | 3/2009 | Fujii | H01G 4/228 361/303 |
| 2009/0090951 A1 | 4/2009 | Chang et al. | |
| 2009/0101622 A1 * | 4/2009 | Wang | H01L 28/60 216/13 |
| 2009/0230509 A1 | 9/2009 | MacIntosh et al. | |
| 2009/0290283 A1 | 11/2009 | Fong et al. | |
| 2009/0296313 A1 | 12/2009 | Chiu et al. | |
| 2010/0141354 A1 | 6/2010 | Cho | |
| 2010/0148304 A1 * | 6/2010 | Rahim | H01L 23/5223 257/532 |
| 2010/0214041 A1 | 8/2010 | Cho | |
| 2010/0271753 A1 * | 10/2010 | Wang | H01G 4/012 361/305 |
| 2010/0309605 A1 | 12/2010 | Lin | |
| 2011/0188168 A1 | 8/2011 | Rogers | |
| 2011/0254132 A1 | 10/2011 | Cho | |
| 2013/0043557 A1 | 2/2013 | Cho | |
| 2013/0043968 A1 | 2/2013 | Cho | |
| 2013/0093045 A1 | 4/2013 | Cho | |
| 2013/0099352 A1 | 4/2013 | Yen et al. | |
| 2014/0167992 A1 * | 6/2014 | Aruga | H01G 4/38 341/143 |

OTHER PUBLICATIONS

Kawano, Y. et al., "A 77GHz Transceiver in 90nm CMOS", 2009 IEEE International Solid-State Circuits Conference, Digest of Technical Papers, ISSCC 2009/Session 18/Ranging and Gb/s Communication/18.3, pp. 310-312.

* cited by examiner

CONCENTRIC CAPACITOR STRUCTURE

CROSS-REFERENCE TO RELATED APPLICATIONS

The present application is a divisional of co-pending U.S. patent application Ser. No. 14/454,760, filed Aug. 8, 2014, entitled "Concentric Capacitor Structure," which is a continuation-in-part of U.S. patent application Ser. No. 13/789,825, filed Mar. 8, 2013, and entitled "Switched Capacitor Structure," which is related to commonly-assigned U.S. patent application Ser. No. 13/411,052, filed Mar. 2, 2012 entitled, "Structure and Method for a Fishbone Differential Capacitor," and commonly-assigned U.S. patent application Ser. No. 13/902,392, filed May 24, 2013, and entitled, "A High Resolution and Process Limitation-Free Switched Capacitance Method and Apparatus," each of which is herein incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. These advances, however, have increased the complexity of processing and manufacturing ICs and, for these advances to be realized, similar developments in IC processing and manufacturing are needed.

Various active and/or passive electronic components can be formed on a semiconductor IC. Capacitors are essential components for many ICs, such as sample-and-hold circuits, analog-to-digital (A/D) circuits, digital-to-analog (D/A) circuits and resonant circuits, switched-capacitor and continuous-time filters, as well as to many radio frequency (RF) applications. Capacitors are extensively used for many logic and other applications in the semiconductor manufacturing industry and are integrated into various types of semiconductor devices. Due to higher integration requirements to minimize costs associated with IC fabrication processes, the semiconductor manufacturing industry strives toward economization of each process step and minimization of chip size, while maximizing quality and functionality to the extent possible. Due to these trends of miniaturization or scaling of ICs to provide smaller ICs and improved performance, capacitor designs that consume low areas and possess high capacitance density are highly desirable.

Analog ICs generally employ various types of integrated capacitors utilizing metal-oxide-semiconductors (MOS) including p-n junction capacitors, metal-insulator-metal (MIM) capacitors, poly-to-poly capacitors, metal-oxide-metal (MOM) capacitors, and other structures. MOM capacitors, also known as vertical parallel plate (VPP) capacitors, can include natural vertical capacitors (NV-CAPs), lateral flux capacitors, comb capacitors, interdigitated finger capacitors, etc. and are one of the most widely used MOS capacitors due to respective characteristics, e.g., high capacitance density, low parasitic capacitance, symmetric design, superior RF characteristics, good matching characteristics, and processing advantages.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

DETAILED DESCRIPTION

Figure 2A:
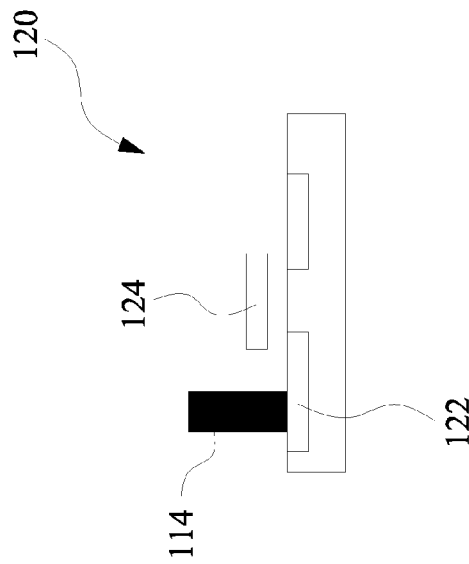
FIG. 2A is a vertical cross section of a switch for the integrated capacitor structure of FIG. 1.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "above" the other devices or characteristics. Therefore, the space orientation term "under" may include two orientations of "above" and "below".

Embodiments of the present disclosure are applicable to various types of integrated capacitors utilizing metal-oxide-semiconductors (MOS) including, but not limited to, p-n junction capacitors, metal-insulator-metal (MIM) capacitors, poly-to-poly capacitors, metal-oxide-metal (MOM) capacitors, and combinations thereof. Exemplary MOM or vertical parallel plate (VPP) capacitors include but are not limited to, natural vertical capacitors (NVCAPs), lateral flux capacitors, comb capacitors, interdigitated finger capacitors, etc. Exemplary capacitors according to embodiments of the present disclosure provide high capacitance density, low parasitic capacitance, symmetric design, superior RF characteristics, good matching characteristics, and superior processing advantages over conventional capacitors.

Exemplary capacitors according to embodiments of the present disclosure can exploit the effect of intralayer and/or interlayer capacitive coupling between plates formed by standard metallization wiring lines and/or vias. Lateral capacitive coupling can provide better matching characteristics than vertical coupling due to a better process control of lateral dimensions than that of metal and dielectric layer thicknesses. To increase the capacity density (capacitance per unit area of silicon chip), several metal layers can be connected in parallel by vias, forming a vertical metal wall or mesh. Normally, the lowest metal layers (e.g., M1-M5 layers) having a minimum metal line width and spacing can be used for exemplary capacitors to maximize capacitance density.

Figure 1:
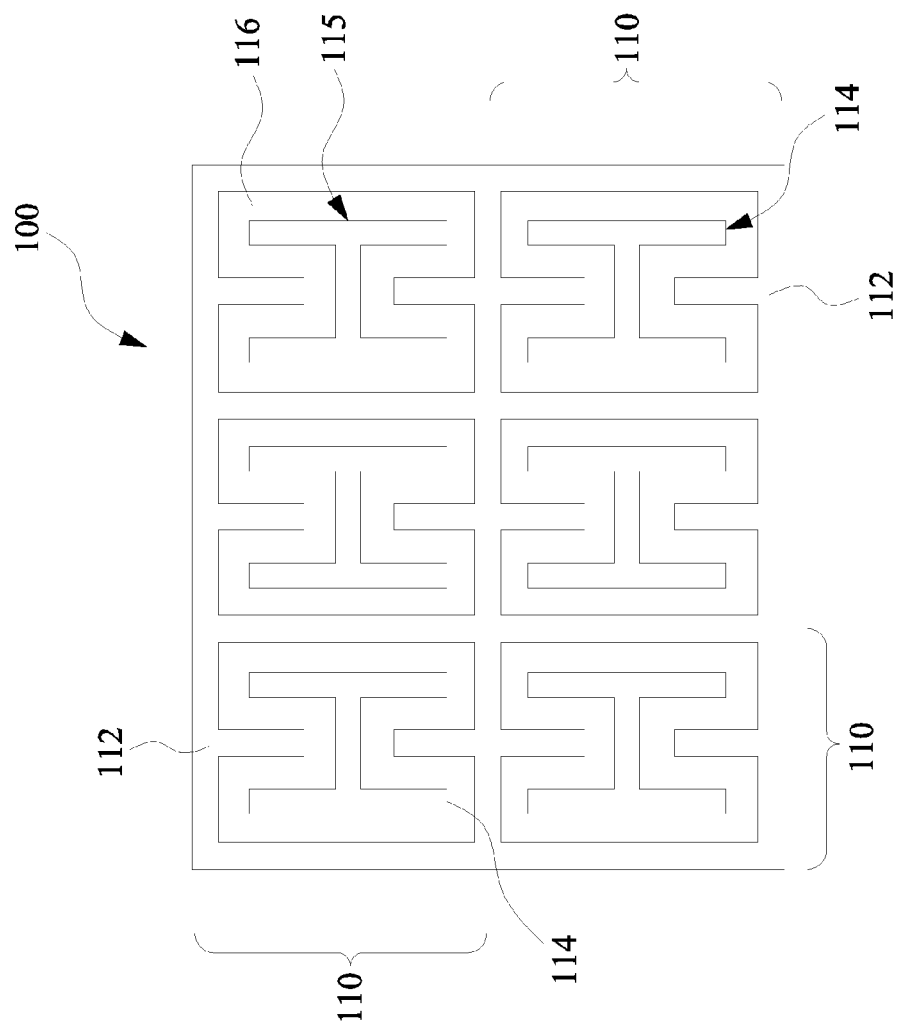
FIG. 1 is a top view of an integrated capacitor structure according to some embodiments of the present disclosure.
Figure 2B:
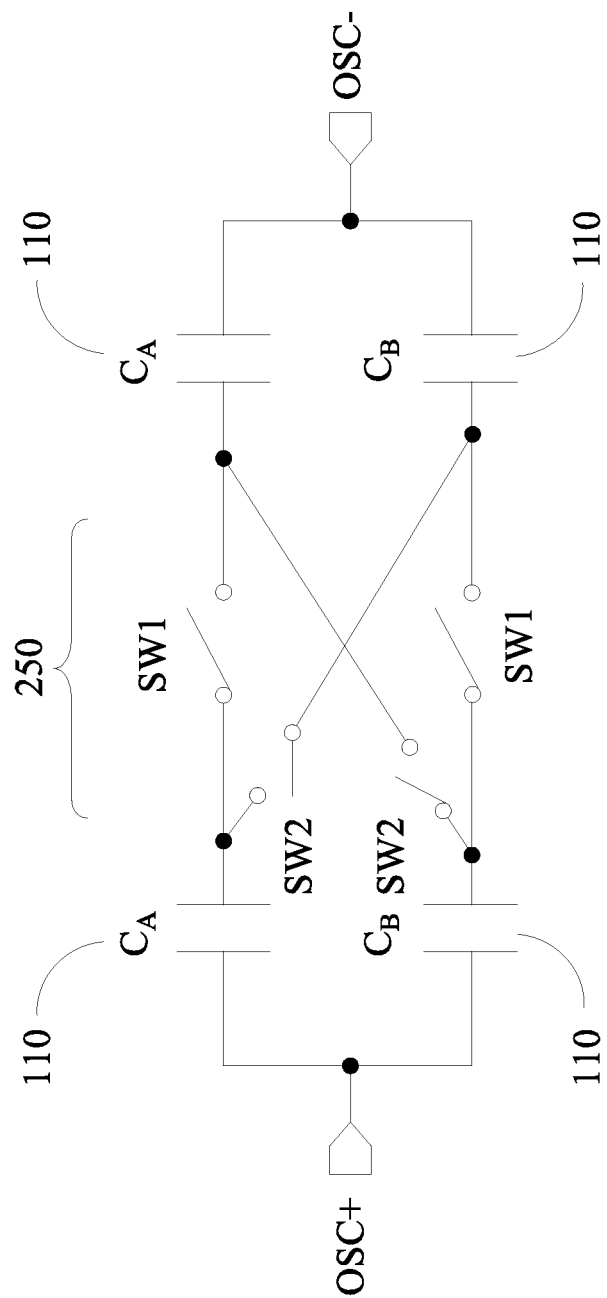
FIG. 2B is a schematic diagram for an exemplary switch.

FIG. 1 is a top view or cross section of an integrated capacitor structure according to some embodiments of the present disclosure. FIG. 2A is a vertical cross section of a switch for the integrated capacitor structure of FIG. 1, and FIG. 2B is a schematic diagram for an exemplary switch. With reference to FIGS. 1, 2A and 2B, an integrated capacitor structure 100 includes a matrix of integrated capacitor units 110, each of which comprises an outer vertical metal plate(s) 112 and an inner vertical metal plate(s) 114. In the non-limiting configuration illustrated in FIG. 1, the inner vertical metal plate(s) 114 forms an H-shaped structure 115 with outer vertical metal plate(s) 11.2 enveloping each structure 115 and separating adjacent units 110 and adjacent, parallel inner vertical metal plates 114 within the H-shaped structure 115. In some embodiments, the interior structures in the capacitor units 110 can possess other suitable geometries. Further, in some embodiments of the present disclosure, an integrated capacitor structure 100 has different or varying interior structures for any number of capacitor units 110 within an exemplary integrated capacitor structure 100. It should also be noted that the number of integrated capacitor units 110 in the illustrated structure 100 is only exemplary as embodiments according to the present disclosure can include more or less than the six integrated capacitor units 110 depicted.

The outer vertical metal plates 112 can be insulated from adjacent inner vertical metal plates 114 using an insulation material 116 such as, but not limited to, interlayer dielectrics or other suitable insulators employed in semiconductor fabrication processes. The outer and inner vertical metal plates 112, 114 can be formed on a semiconductor substrate (not shown) and can be formed from several metal layers connected in parallel by vias, or otherwise, to thereby form a vertical metal wall or mesh. The outer vertical metal plate 112 can be electrically connected to a signal line (not shown), and the inner vertical metal plate(s) 114 can be electrically connected to a ground node 122 in a switch 120 depicted in FIG. 2A. Exemplary switches 120 can comprise one or more grounding nodes 122 and/or gate notes 124 whereby each interior structure 115 is connected to one switch 120. Exemplary switches 120 can be, but are not limited to, a metal-oxide-semiconductor field effect transistor (MOSFET), a diode, a bipolar junction transistor (BJT), a PN transistor, an NP transistor, an NPN transistor, a PNP transistor, or other switching mechanism. In some embodiments of the present disclosure, an exemplary integrated capacitor structure 100 can comprise a plurality of different switches for the respective units 110 within the integrated capacitor structure 100. Further, any or all of the capacitor units 110 can be independently tuned by a respective switch 120.

For example, various embodiments of the present disclosure can provide an exemplary high resolution and low area switched capacitance technique and system to switch between capacitor units 110 within a structure 100. One such technique is illustrated in FIG. 2B where appropriate switching mechanisms 250 or sets thereof, e.g., diode, transistor, etc. are utilized to switch between one or more sets or banks of capacitors or capacitor units within a structure. Such an exemplary switching mechanism can be employed to change capacitance thereby affecting oscillation frequency in a respective device. Additional discussion regarding this and other exemplary, non-limiting switching mechanisms are provided in commonly-assigned U.S. patent application number Ser. No. 13/902,392 filed May 24, 2013 and entitled, "A High Resolution and Process Limitation-Free Switched Capacitance Method and Apparatus," the entire disclosure of which is incorporated herein by reference. Thus, an exemplary structure 100 can provide a wide range of capacitance for various applications. As the sides of each of the integrated capacitor units 110 are facing substantially similar environments, the integrated capacitor structure 100 provides exemplary matching characteristics and there is no need to provide dummy metals that typically surround conventional capacitor units.

Figure 4:
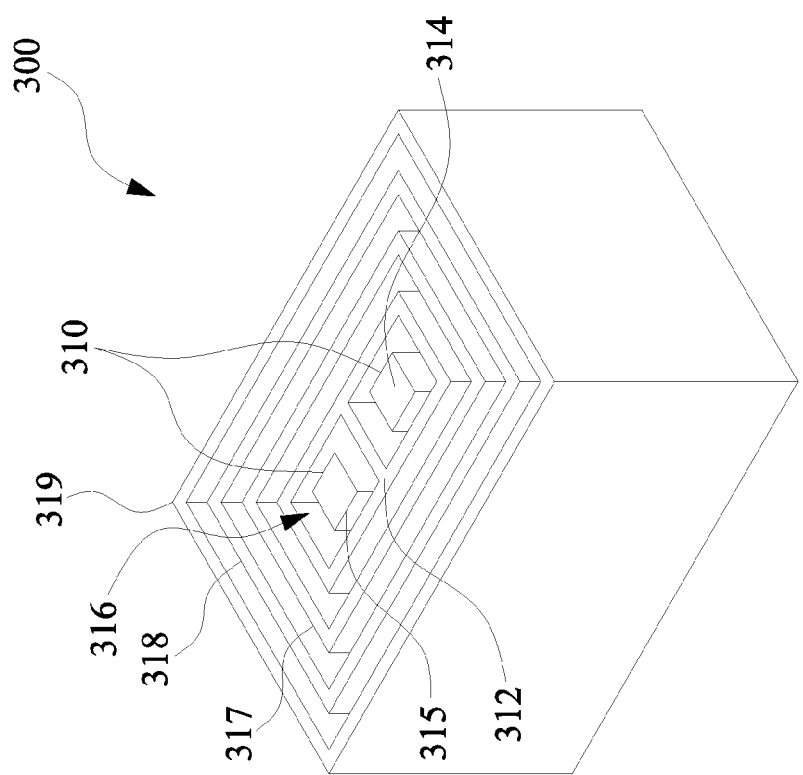
FIG. 4 is a perspective view of the integrated capacitor structure of FIG. 3.
Figure 3:
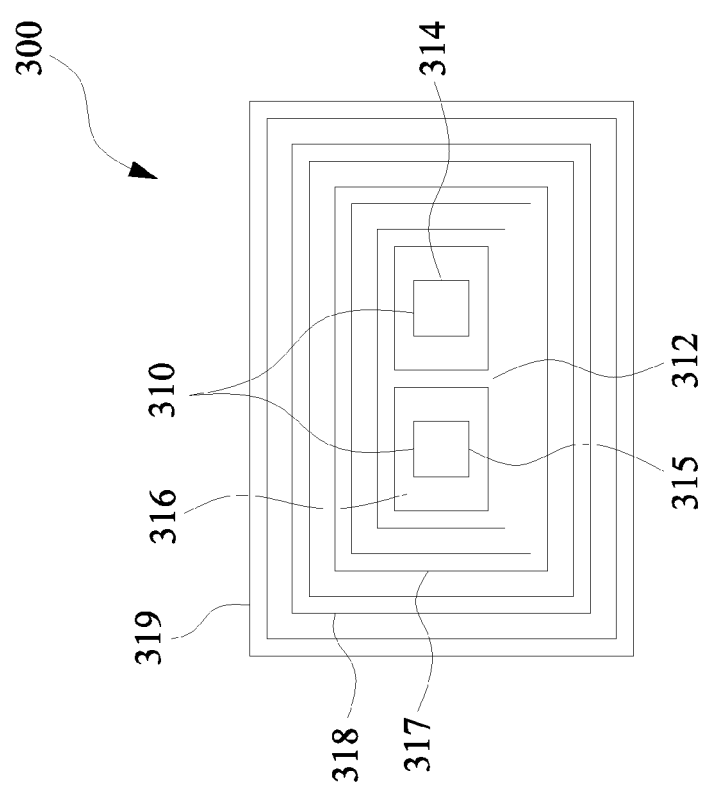
FIG. 3 is a top view of an integrated capacitor structure according to other embodiments of the present disclosure.

FIG. 3 is a top view or cross section of an integrated capacitor structure according to other embodiments of the present disclosure. FIG. 4 is a perspective view of the integrated capacitor structure of FIG. 3. With reference to FIGS. 3 and 4, an integrated capacitor structure 300 includes two interior integrated capacitor units 310, each of which comprises an outer vertical metal plate(s) 312 and an inner vertical metal plate(s) 314 or post. Vertical metal plates (s) 312 may also comprise metal layer(s) and via(s) in between. In the non-limiting embodiment illustrated in FIG. 3, the inner vertical metal plate(s) 314 forms a post-like structure 315 with outer vertical metal plate(s) 312 enveloping each structure 315 and separating adjacent units 310. Of course, the interior structures in the capacitor units 310 can possess other geometries in some embodiments. Further, some embodiments of the present disclosure can provide an integrated capacitor structure 300 having different or varying interior structures for any number of capacitor units 310, and it should also be noted that the number of integrated capacitor units 310 within the illustrated structure 300 is only exemplary as embodiments according to the present disclosure can include more or less than the two integrated capacitor units 310 depicted. As illustrated in FIGS. 3 and 4, additional plates 317, 318, 319 can be concentrically provided in coils for an exemplary integrated capacitor structure 300.

Adjacent vertical metal plates 312, 314, 317, 318, 319 can be insulated from each other using an insulation material 316 such as, but not limited to, interlayer dielectrics or other suitable insulators employed in semiconductor fabrication processes. These metal plates can be formed on a semiconductor substrate (not shown) and can be formed from several metal layers connected in parallel by vias, or otherwise, to thereby form a vertical metal wall or mesh. The outer vertical metal plate 312 and additional plate(s) 318 can be electrically connected to a signal line (not shown), and the inner vertical metal plate(s) 314 and additional plates 317, 319 can be electrically connected to a ground node in an exemplary switch described above. Exemplary switches can be, but are not limited to, a MOSFET, a diode, a BJT, a PN transistor, an NP transistor, an NPN transistor, a PNP transistor, or other switching mechanism. In some embodiments of the present disclosure, an exemplary integrated capacitor structure 300 can comprise a plurality of different switches for the respective units 310 within the integrated capacitor structure 300. Further, any or all of the capacitor units 310 can be independently tuned by a respective switch. Thus, an exemplary structure 300 can provide a wide range of capacitance for various applications. For example, in some embodiments of the present disclosure an inner structure or coil can possess a capacitance of 1 fF with concentric coils or structures possessing capacitances of 2 fF, 4 fF, 8 fF, etc. Thus, some embodiments can utilize the structure depicted in FIGS. 3 and 4 to provide a varactor-like capacitor.

Figure 6:
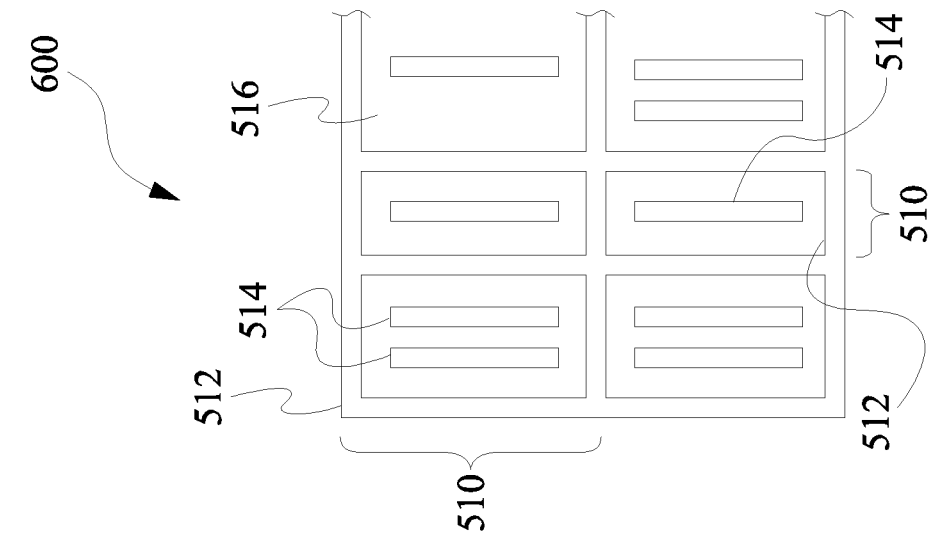
FIGS. 5-10 provide top views of various integrated capacitor structures according to embodiments of the present disclosure.
Figure 5:
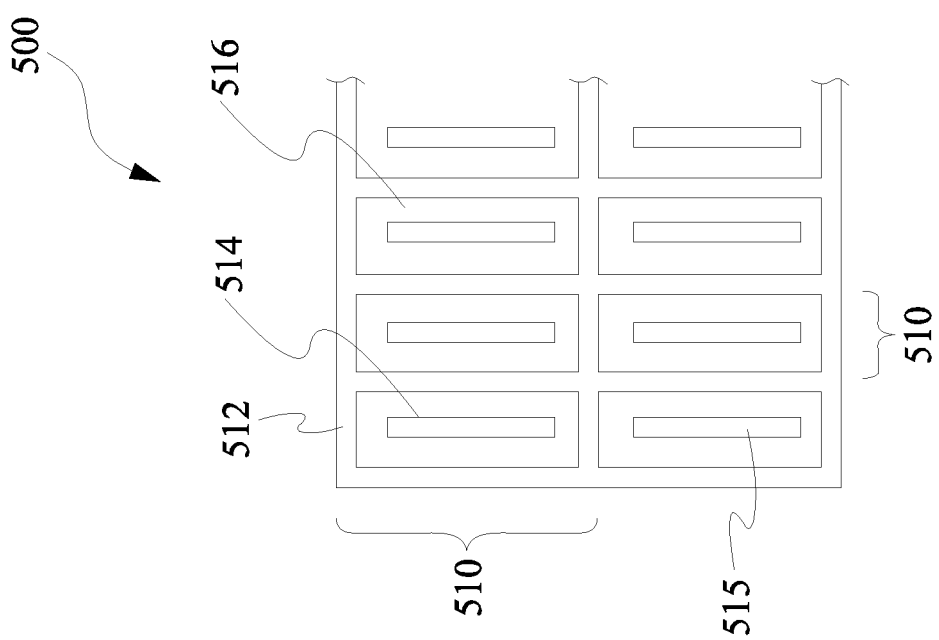

FIGS. 5-10 provide top views or cross sections of various integrated capacitor structures according to additional embodiments of the present disclosure. With reference to FIGS. 5 and 6, integrated capacitor structures 500, 600 can include a matrix of integrated capacitor units 510, each of which comprises an outer vertical metal plate(s) 512 and an inner vertical metal plate(s) 514. In the non-limiting configuration illustrated in FIG. 5, the inner vertical metal plate(s) 514 forms an I-shaped structure 515 with outer vertical metal plate(s) 512 enveloping each structure 515 and separating adjacent units 510 and adjacent, parallel inner vertical metal plates 514 within the I-shaped structure 515. The interior structures 515 in the capacitor units 510 can possess other geometries in some embodiments. In the non-limiting configuration illustrated in FIG. 6, the inner vertical metal plate(s) 514 forms one or more I-shaped structures 515 with the outer vertical metal plate 512 enveloping each structure(s) 515 and separating adjacent units 510. As illustrated, some units 510 can include a plurality of inner vertical metal plates 514. It should be also noted that the number of integrated capacitor units 510 in the illustrated structures 500, 600 is only exemplary as embodiments according to the present disclosure can include more or less than the eight integrated capacitor units 510 depicted. The outer vertical metal plates 512 can be insulated from adjacent inner vertical metal plates 514 using an insulation material 516 such as, but not limited to, interlayer dielectrics or other suitable insulators employed in semiconductor fabrication processes. The outer and inner vertical metal plates 512, 514 can be formed on a semiconductor substrate (not shown) and can be formed from several metal layers connected in parallel by vias, or otherwise, to thereby form a vertical metal wall or mesh. The outer vertical metal plate 512 can be electrically connected to a signal line (not shown), and the inner vertical metal plate(s) 51.4 can be electrically connected to a ground node in an exemplary switch described above. In some embodiments, if the switch is "ON", the inner vertical plate(s) 514 is connected to the ground. Conversely, in some embodiments if the switch is "OFF", the inner vertical plates are floating which provides a minor parasitic between the outer and inner vertical metal plates 512, 514. In additional embodiments of the disclosure, each different section of the inner metal plate 514 can be connected to the same or to different switches to control capacitance of the respective device based on the design specifications therefor. Exemplary switches can be, but are not limited to, a MOSFET, a diode, a BJT, a PN transistor, an NP transistor, an NPN transistor, a PNP transistor, or other switching mechanism. In some embodiments of the present disclosure, exemplary integrated capacitor structures 500, 600 can comprise a plurality of different switches for the respective units 510 within the integrated capacitor structures 500, 600. Further, any or all of the capacitor units 510 can be independently timed by a respective switch. Thus, exemplary structures 500, 600 can provide a wide range of capacitance for various applications.

Figure 8:
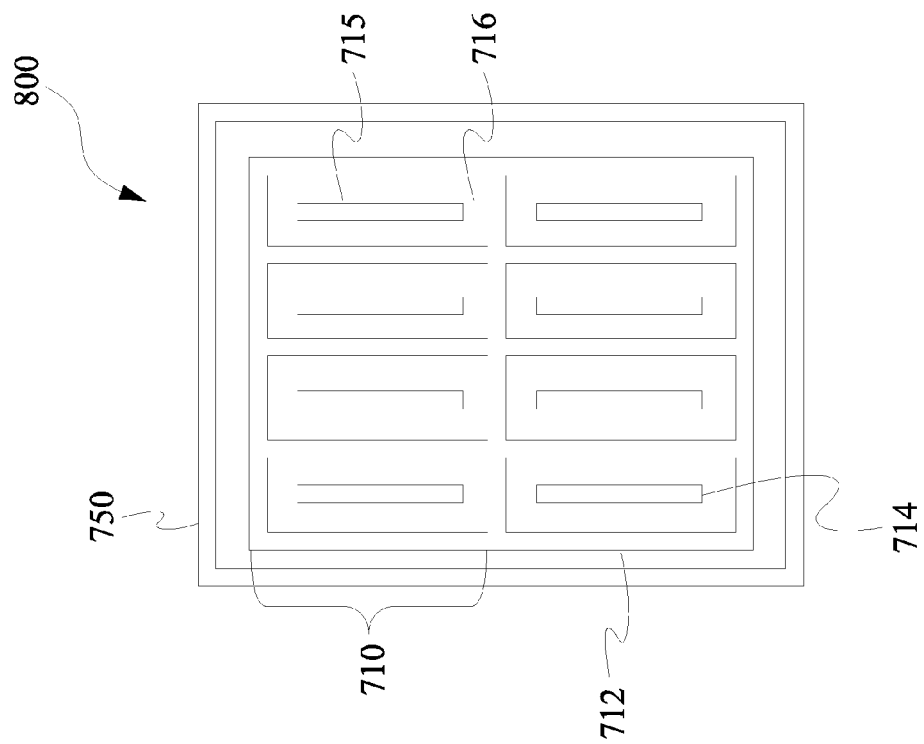
Figure 7:
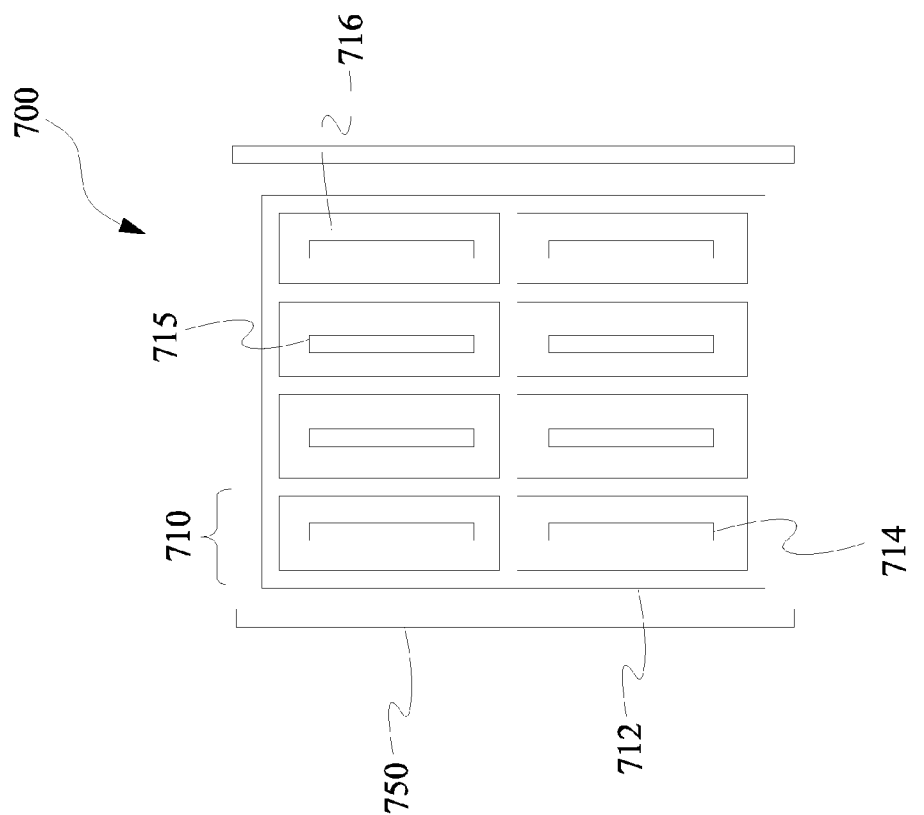

With reference to FIGS. 7 and 8, integrated capacitor structures 700, 800 include a matrix of integrated capacitor units 710, each of which comprises an outer vertical metal plate(s) 712 and an inner vertical metal plate(s) 714. In the non-limiting configurations illustrated in FIGS. 7 and 8, the inner vertical metal plate(s) 714 form an I-shaped structure 715 with the outer vertical metal plate 712 enveloping each structure 715 and separating adjacent units 710 and adjacent, parallel inner vertical metal plates 714 within the I-shaped structure 715. The capacitor units 710 can possess other suitable geometries in some embodiments. It should be also noted that the number of integrated capacitor units 710 in the illustrated structures 700, 800 is only exemplary as embodiments according to the present disclosure can include more or less than the eight integrated capacitor units 710 depicted. In the depicted configurations, additional vertical metal plates 750 can envelope the capacitor structure 800 (FIG. 8) or partially enclose the capacitor structure 700 (FIG. 7). Additional concentric plates (not shown) or coils can also be employed to provide structures having varying and tunable capacitances such as the concentric plates illustrated in FIGS. 3 and 4. The outer vertical metal plate(s) 712 can be insulated from adjacent inner vertical metal plates 714 and/or additional plates 750 using an insulation material 716 such as, but not limited to, interlayer dielectrics or other suitable insulators employed in semiconductor fabrication processes. The vertical metal plates 712, 714, 750 can be formed on a semiconductor substrate (not shown) and can be formed from several metal layers connected in parallel by vias, or otherwise, to thereby form a vertical metal wall or mesh. The outer vertical metal plate(s) 712 and/or any additional plates, as applicable, can be electrically connected to a signal line (not shown), and the inner vertical metal plate(s) 714 and/or additional plates 750 can be electrically connected to a ground node in an exemplary switch described above. Exemplary switches can be, but are not limited to, a MOSFET, a diode, a BJT, a PN transistor, an NP transistor, an NPN transistor, a PNP transistor, or other switching mechanism. In some embodiments of the present disclosure, exemplary integrated capacitor structures 700, 800 can comprise a plurality of different switches for the respective units 710 within the integrated capacitor structures 700, 800. Further, any or all of the capacitor units 710 can be independently tuned by a respective switch. Thus, exemplary structures 700, 800 can provide a wide range of capacitance for various applications.

Figure 9:
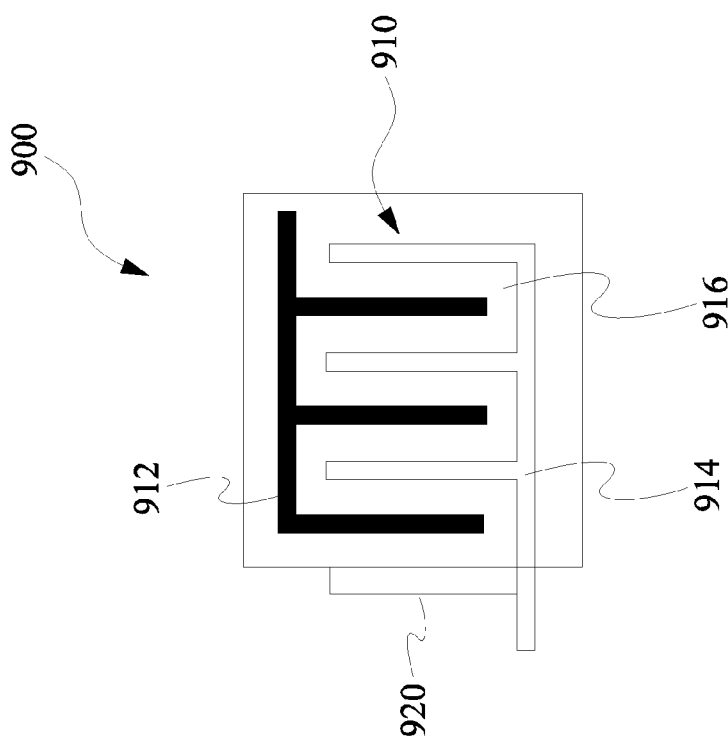

With reference to FIG. 9, an integrated capacitor structure 900 includes an interdigitated finger matrix 910 having a first set 912 of finger structures including vertical metal plates and a second set 914 of finger structures also including vertical metal plates. It should be also noted that the number of interdigitated fingers in the illustrated structure 900 is only exemplary as embodiments according to the present disclosure can include more or less than the three digits depicted. The first and second sets 912, 914 of finger structures can be insulated from each other and adjacent digits in the same set using an insulation material 916 such as, but not limited to, interlayer dielectrics or other insulators employed in semiconductor fabrication processes. The first and second sets 912, 914 can be formed on a semiconductor substrate (not shown) and can be formed from several metal layers connected in parallel by vias, or otherwise, to thereby form a vertical metal wall or mesh. One of the two sets of finger structures 912 or 914 can be electrically connected to a signal line (not shown), and the other set of finger structures 914 or 912 can be electrically connected to a ground node in an exemplary switch 920 described above. Exemplary switches can be, but are not limited to, a MOSFET, a diode, a BJT, a PN transistor, an NP transistor, an NPN transistor, a PNP transistor, or other switching mechanism. In some embodiments of the present disclosure, the structure 900 can be a MOM capacitor.

Figure 10:
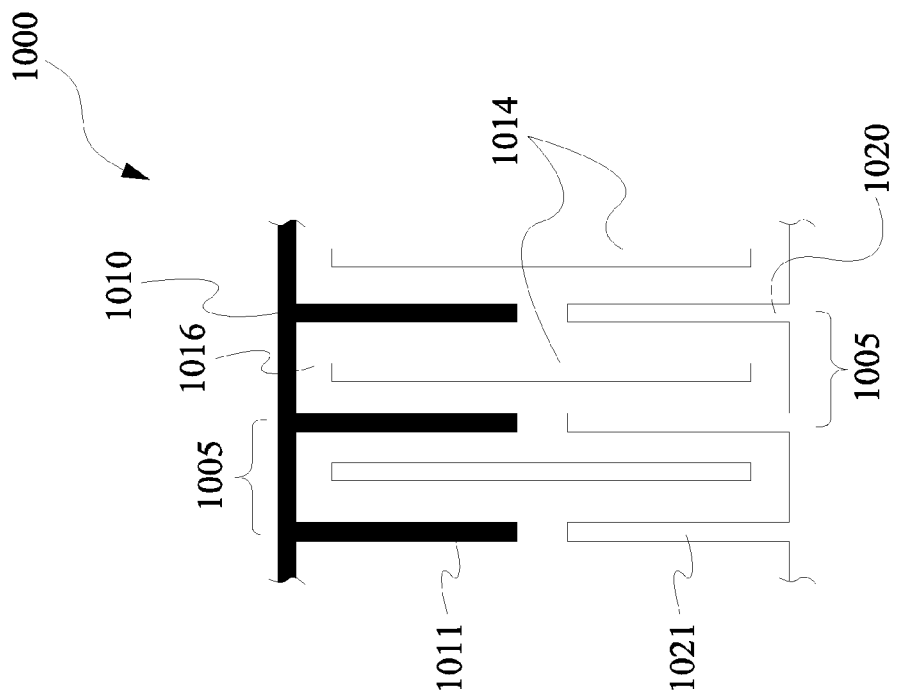

With reference to FIG. 10, an exemplary integrated capacitor structure 1000 can be a differential capacitor comprising a first interdigitated structure 1010 opposing a second interdigitated structure 1020 each electrically connected to a signal line (not shown). Digits 1011, 1021 of the respective structures complement and can, in some embodiments, mirror opposing digits on the other structure thereby forming a plurality of differential capacitor units 1005. Each of the digits 1011, 1021 and connecting portions thereof comprise vertical metal plates. Positioned in these differential capacitor units 1005 and hence between digits 1011, 1021 of the first and second interdigitated structures 1010, 1020 are interior vertical metal plates 1014 each electrically connected to a ground node in an exemplary switch described above. Of course, the interior vertical metal plates 1014 can possess any suitable geometry. Exemplary switches can be, but are not limited to, a MOSFET, a diode, a BJT, a PN transistor, an NP transistor, an NPN transistor, a PNP transistor, or other switching mechanism. It should be noted that the number of differential capacitor units 1005 in the illustrated structure is only exemplary as embodiments according to the present disclosure can include more or less than the three differential capacitor units 1005 depicted. The digits 1011, 1012 and interior metal plates 1014 can be insulated from adjacent vertical metal plates using an insulation material 1016 such as, but not limited to, interlayer dielectrics or other suitable insulators employed in semiconductor fabrication processes. The vertical metal plates can be formed on a semiconductor substrate (not shown) and can be formed from several metal layers connected in parallel by vias, or otherwise, to thereby form a vertical metal wall or mesh. In some embodiments of the present disclosure, an exemplary integrated capacitor structure 1000 can comprise a plurality of different switches for the respective units 1005. Further, any or all of the capacitor units 1005 can be independently tuned by a respective switch. Thus, an exemplary differential capacitor structure 1000 can provide a wide range of capacitance for various applications.

Figure 11:
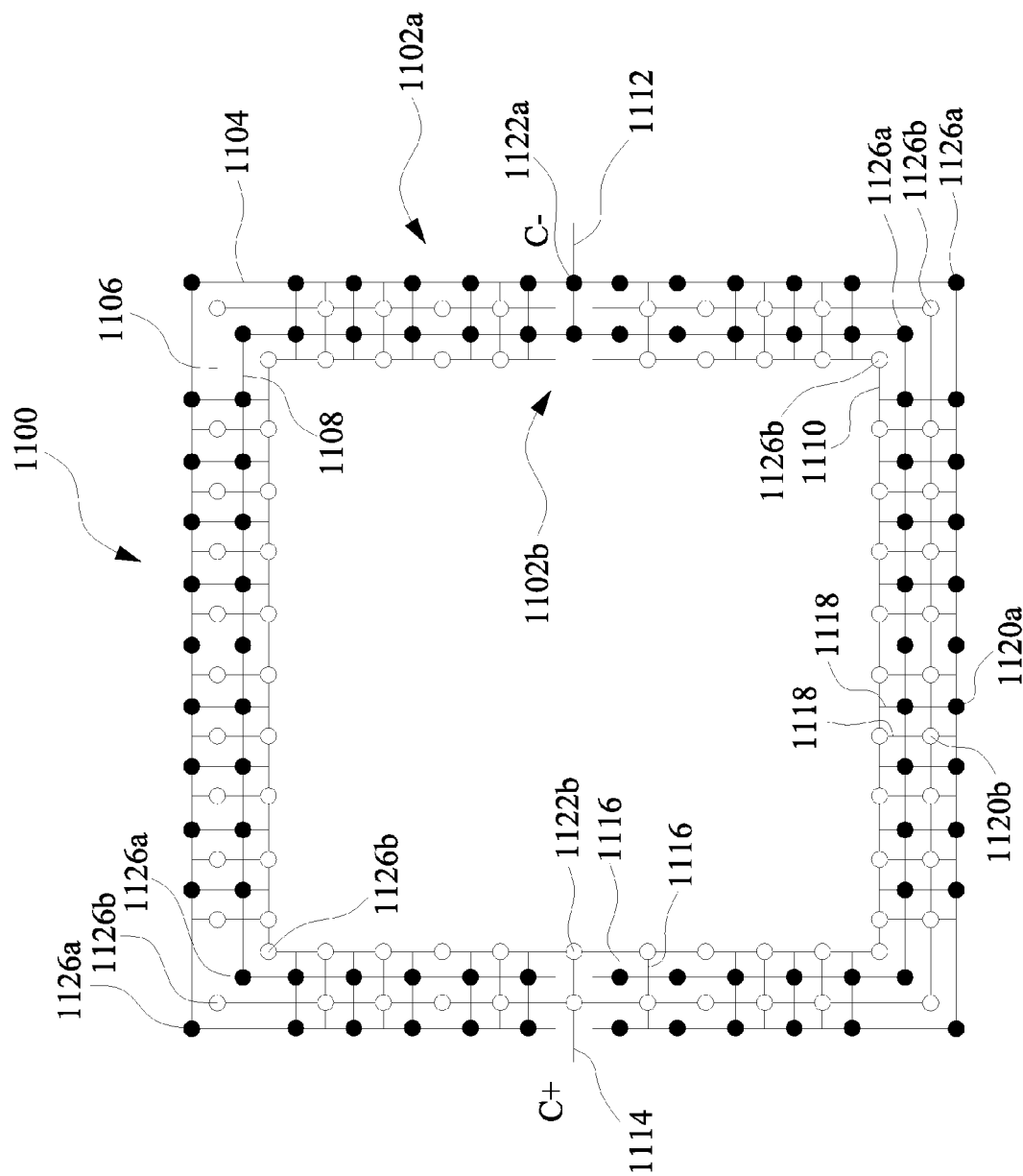
FIG. 11 illustrates a concentric capacitor structure according to some embodiments of the present disclosure.

FIG. 11 is a top view of one embodiment of a concentric capacitor structure 1100. The concentric capacitor structure 1100 comprises a plurality of concentric capacitors 1102a, 1102b. Each of the concentric capacitors 1102a, 1102b comprise a first concentric capacitive plate 1104, 1108 and a second concentric capacitive plate 1106 1110. The first concentric capacitive plates 1104, 1108 are coupled to a first unidirectional metal 1112 and the second concentric capacitive plates 1106, 1110b are coupled to a second unidirectional metal 1114. In some embodiments, each of the first concentric capacitive plates 1104, 1108 define a negative capacitive plate and each of the second concentric capacitive plates 1106, 1110 define a positive capacitive plate. Each of the capacitive plates 1104, 1106, 1108, 1110 comprise a plurality orthogonal metal routing plates formed in at least a first routing layer 1124a and a second routing layer 1124b, as shown in FIGS. 11B and 11C respectively.

Figure 11A:
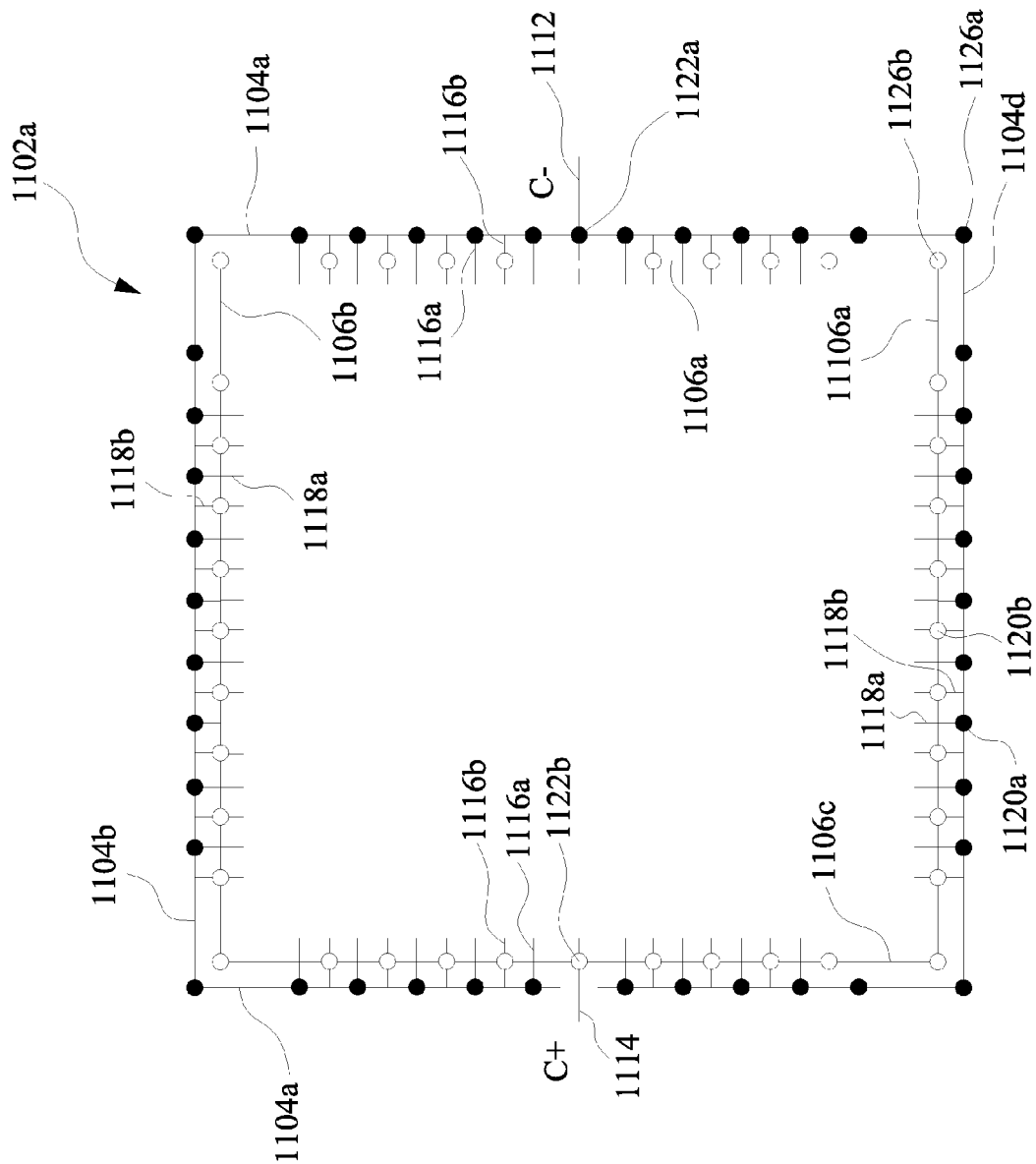
FIG. 11A illustrates a first concentric capacitor of the concentric capacitor structure illustrated in FIG. 11.
Figure 11B:
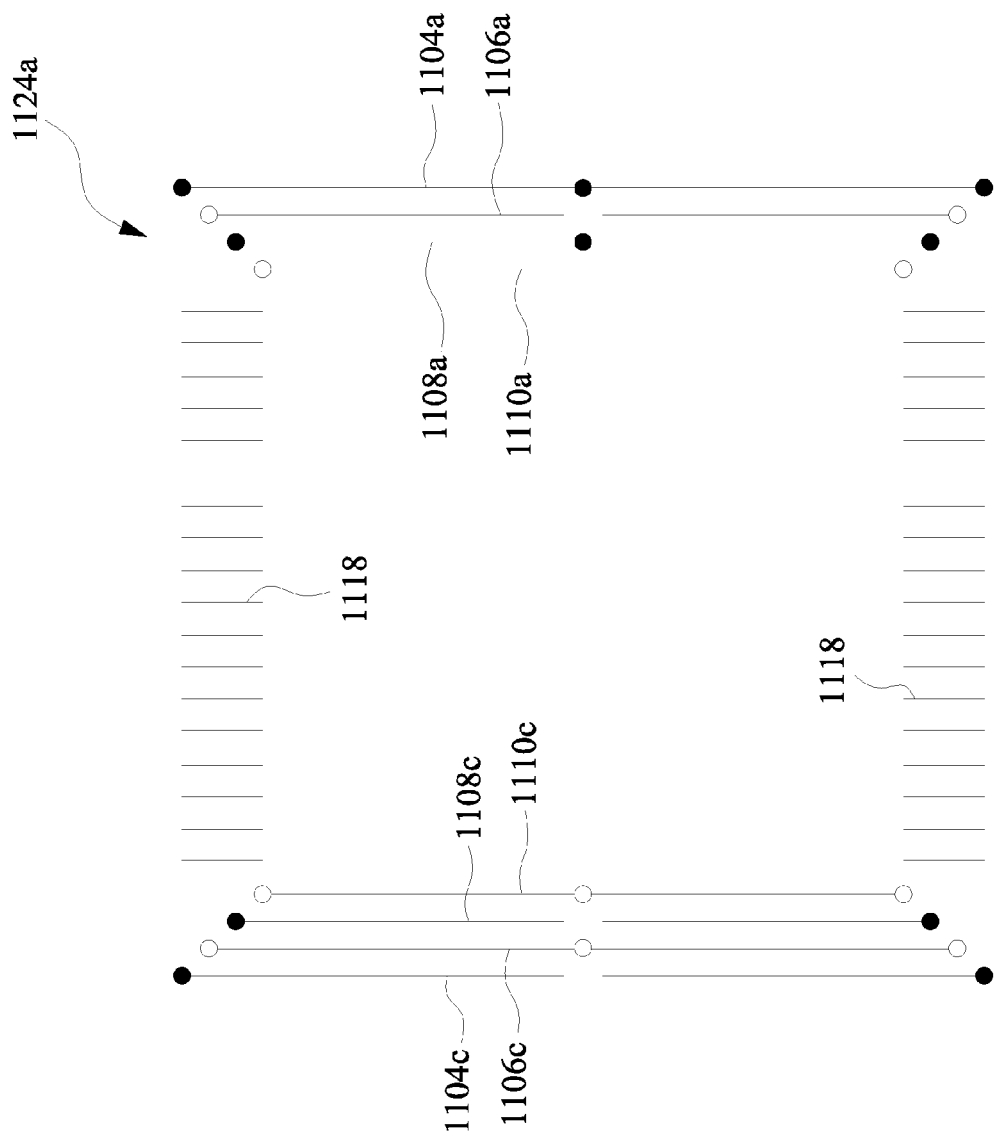
FIG. 11B illustrates a first routing layer of the concentric capacitor structure of FIG. 11.
Figure 11C:
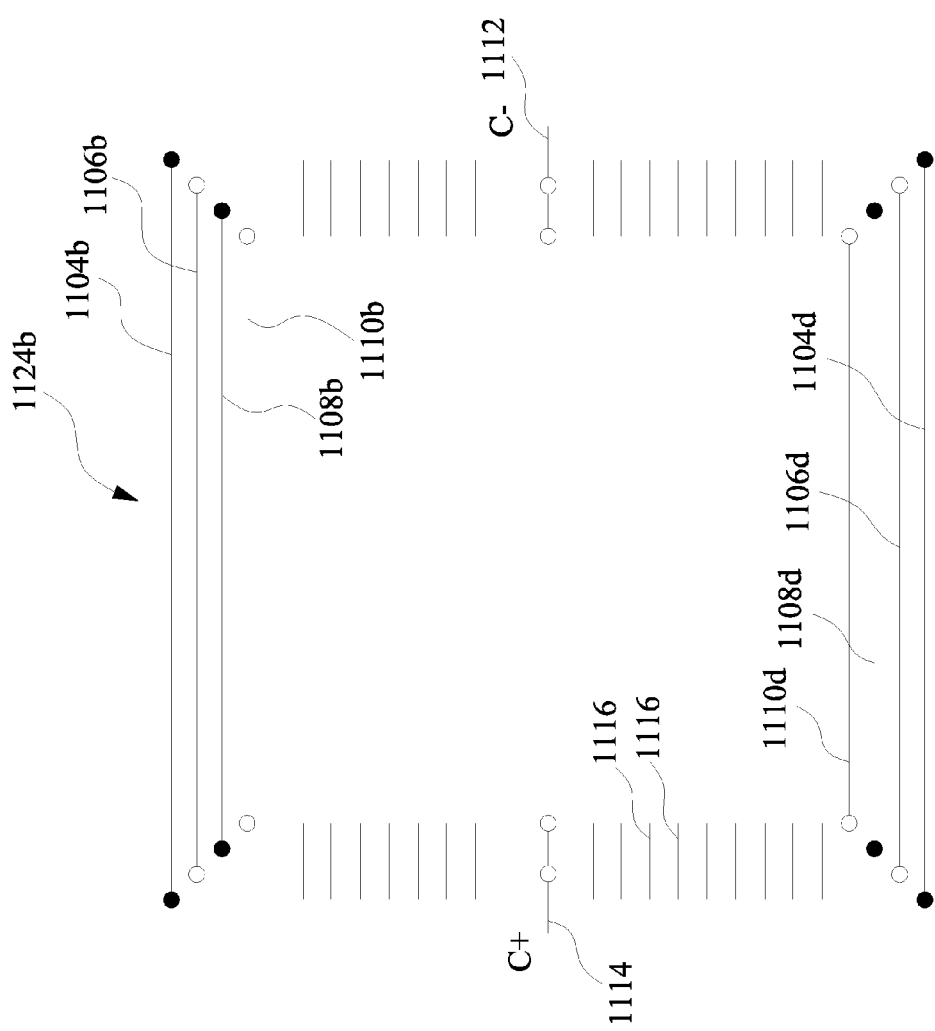
FIG. 11C illustrates a second routing layer of the concentric capacitor structure of FIG. 11.

FIG. 11A illustrates the first concentric capacitor 1102a. The first concentric capacitor 1102a comprise a first concentric capacitive plate 1104 and a second concentric capacitive plate 1106. The first concentric capacitive plate 1104 comprises a first set of metal routing plates 1104a-1104d (or perimeter plates 1104a-1104d). The second concentric capacitive plate 1106 comprises a second set of metal routing plates 1106a-1106d (also referred to as perimeter plates herein). The perimeter plates 1104a-1106d define the perimeters of the respective concentric capacitive plates 1104, 1106. A first subset of each of the first and second sets of perimeter plates 1104a, 1104c, 1106a, 1106c are formed in a first routing layer 1124a and extend longitudinally in a first direction. A second subset of each of the first and second set of perimeter plates 1104b, 1104d, 1106b, 1106d are formed in a second routing layer 1124b and extend longitudinally in a second direction. In some embodiments, the first direction is orthogonal to the second direction. The ends of the first subset of perimeter plates 1104a, 1104c, 1106a, 1106c overlap the ends of the second subset of perimeter plates 1104b, 1104d, 1106b, 1106d. The first set of perimeter plates 1104a-1104d are coupled by a plurality of inter-layer vias 1126a coupling the ends of each of the first plurality of perimeter plates 1104a-1104d to define a first continuous capacitive plate 1104. Similarly, the second set of perimeter plates 1106a-1106d are coupled by a plurality of inter-layer vias 1126b to define a second continuous capacitive plate 1106. As used herein, reference numbers 1104-1110 are used to refer to the concentric capacitor plates as a single connected plate. References to reference numbers having letters, for example, references to reference number 1104a-1104d, refer to individual perimeter plates of the concentric capacitor plates.

Each of the concentric capacitors 1102a, 1102b comprise a plurality of cross-plate routing plates 1116, 1118. The cross-plate routing plates 1116, 1118 extend from at least the first concentric capacitive plate 1104, 1108 of a concentric capacitor 1102a, 1102b to at least the second concentric capacitive plate 1106, 1110 of the concentric capacitor 1102a, 1102b. For example, as illustrated in FIG. 11A, the first concentric capacitor 1102a comprises a first plurality of cross-plate routing plates 1116 extending from first perimeter plates 1104a and 1104c to second perimeter plates 1106a and 1106c. Similarly, a second plurality of cross-plate routing plates 1118 extend from first perimeter plates 1104b and 1104d to second perimeter plates 1106b and 1106d. In some embodiments, the cross-plate routing plates 1116, 1118 extend from an outermost perimeter plate 1104a to an innermost perimeter plate 1106b (see FIGS. 11B and 11C).

The cross-plate routing plates 1116, 1118 are formed in an opposite routing layer from the routing layer comprising the overlapping perimeter plates. For example, as shown in FIG. 11B, the first perimeter plates 1104a and 1104c and second perimeter plates 1106*a* and 1106*c* are formed in the first routing layer 1124*a*. The first set of cross-plate routing plates 1116, which overlap the first perimeter plates 1104*a*, 1104*c* and second perimeter plates 1106*a*, 1106*c*, are formed in the second routing layer 1124*b* (see FIG. 11C). Similarly, the first perimeter plates 1104*b* and 1104*d* and second perimeter plates 1106*b* and 1106*d* are formed in the second routing layer. The second set of cross-plate routing plates 1118, which overlap the first perimeter plates 1104*b*, 1104*d* and second perimeter plates 1106*b*, 1106*d*, are formed in the first routing layer 1124*a*.

In some embodiments, the cross-plate routing plates 1116, 1118 extend in a direction orthogonal to the longitudinal direction of the overlapping perimeter plates 1104*a*-1106*d*. For example, as shown in FIG. 11A, the first perimeter plates 1104*a* and 1104*c* and second perimeter plates 1106*a* and 1106*c* extend longitudinally in the first direction. The first set of cross-plate routing plates 1116 overlap the first perimeter plates 1104*a*, 1104*c* and second perimeter plates 1106*a*, 1106*c* and extend longitudinally in the second direction. Similarly, the first perimeter plates 1104*b* and 1104*d* and second perimeter plates 1106*b* and 1106*d* extend longitudinally in the second direction. The second set of cross-plate routing plates 1118 overlap the first perimeter plates 1104*b*, 1104*d* and second perimeter plates 1106*b*, 1106*c* and extend longitudinally in the first direction. The cross-plate routing plates 1116, 1118 are coupled to the perimeter plates 1104*a*-1106*d* by a plurality of inter-layer vias 1120*a*, 1120*b*. Although embodiments having orthogonal plates are illustrated herein, it will be recognized that the cross-plate routing plates and overlapping perimeter plates may overlap at any suitable angle. For example, in some embodiments, the cross-plate routing plates may extend in a forty-five degree angle, or any other suitable angle, with respect to the overlapping perimeter plates.

In some embodiments, each routing layer 1124*a*, 1124*b* comprises metal routing plates extending in a single longitudinal direction. FIGS. 11B & 11C respectively illustrate the first and second routing layers 1124*a*, 1124*b* of the concentric capacitive structure 1100. As shown in FIG. 11B, the first routing layer 1124*a* comprises first perimeter plates 1104*a*, 1104*c*, second perimeter plates 1106*a*, 1106*c*, and the second plurality of cross-plate routing plates 1118. Each of the first perimeter plates 1104*a*, 1104*c*, second perimeter plates 1106*a*, 1106*c*, and second plurality of cross-plate routing plates 1118 extend longitudinally in the first direction. Similarly, as shown in FIG. 11C, the second routing layer 1124*b* comprises first perimeter plates 1104*b*, 1104*d*, second perimeter plates 1106*b*, 1106*d*, and the first plurality of cross-plate routing plates 1116. Each of the first perimeter plates 1104*b*, 1104*d*, second perimeter plates 1106*b*, 1106*d*, and first plurality of cross-plate routing plates 1116 extend longitudinally in the second direction.

In some embodiments, the first direction is perpendicular to the second direction. In some embodiments, the perimeter plates 1104*a*-1106*d* extend in third orthogonal direction to define a capacitive plate area. In some embodiments, the concentric capacitive structure 1100 comprises additional routing layers comprising perimeter plates and/or cross-plate routing plates that are symmetric with the routing plates formed on one of the first routing layer 1124*a* or the second routing layer 1124*b*.

The cross-plate routing plates 1116, 1118 are coupled to the capacitive plates 1104, 1106, 1108, 1110 by a plurality of vias 1120*a*, 1120*b* (or contacts). A first set of vias 1120*a* couple the first capacitive plates 1104, 1108 to a first set of cross-plate routing plates 1116*a*, 1118*a*. A second set of vias 1120*b* couple the second capacitive plates 1106, 1110 to a second set of cross-plate routing plates 1116*b*, 1118. In the illustrate embodiment, the first set of cross-plate routing plates 1116*a*, 1118*a* are alternated with the second set of cross-plate routing plates 1116*b*, 1118. It will be recognized that any suitable pattern of coupling the cross-plate routing plates 1116, 1118 to the concentric capacitive plates 1104-1110 may be used.

In some embodiments, the first capacitive plates 1104, 1108 are coupled to a first unidirectional metal 1112 to define negative capacitive plates, or C− plates, of the concentric capacitors 1102*a*, 1102*b*. The second capacitive plates 1106, 1110 are coupled to a second unidirectional metal 1114 to define positive capacitive plates, or C+ plates, of the concentric capacitors 1102*a*, 1102*b*. It should be noted that the number of concentric capacitive structures 1102*a*, 1102*b* is only exemplary and embodiments according to the present disclosure can include more or less than the two concentric sets of capacitive plates depicted.

Each of the cross-plate routing plates 1116, 1118 are coupled to at least one of the concentric capacitive plates 1104-1110. In some embodiments, the cross-plate routing plates 1116, 1118 extend from an outer capacitive plate 1104 to an inner capacitive plate 1110. The cross-plate routing plates 1116-1118 may be coupled to multiple concentric capacitive plates 1104-1110 having the same polarity. For example, with reference to FIG. 11, a first set of the cross-plate routing plates 1116*a*, 1118*a* are coupled to each of the first concentric capacitive plates 1104, 1108 (negative capacitive plates) and a second set of the cross-plate routing plates 1116*b*, 1118 are coupled to each of the second concentric capacitive plates 1106, 1110 (positive capacitive plates). In some embodiments, each of the cross-plate routing plates 1116, 1118 are coupled to a single concentric capacitive plate 1104-1110.

The cross-plate routing plates 1116, 1118 provide an increased capacitance to the concentric capacitors 1102*a*, 1102*b*. The cross-plate routing plates 1116-1118 are coupled to the concentric capacitive plates 1104-1110 and will develop a charge when the concentric capacitive plates 1104-1110 are coupled to a signal. In some embodiments, a capacitive charge is developed between cross-plate routing plates 1116-1118 alternatively coupled to the positive and negative capacitive plates 1104-1110.

In traditional concentric capacitor structures, the concentric capacitors have a ½ capacitance loss in each direction as compared to a concentric capacitive structure 1100 having the same layout area. In other words, traditional concentric capacitor structures or require four times the capacitive area to produce the same capacitance as the layout area of the concentric capacitive structure 1100. The concentric capacitor structure 1100 provides a natural common-centroid placement, which reduces process variation and ensures coherent variations of the concentric capacitors 1102*a*, 1102*b*. The concentric capacitor structure 1100 is compatible with an unidirectional one-dimensional back end of the line (BEOL) process that can be used to manufacture a semiconductor structure, including the concentric capacitor structure 1100

In some embodiments, the first routing layer 1124*a* is separated from the second routing layer 1124*b* by one or more insulators. For example, the first routing layer 1124*a* and the second routing layer 1124*b* may be separated by an insulator such as, for example, interlayer dielectrics. The perimeter plates and/or the cross-plate routing plates 1116, 1118 within each routing layer may be insulated from the other routing plates within the routing layer by an insulation material, such as, for example, intralayer dielectrics or other suitable insulators. In some embodiments, an air gap exists between the negative capacitive plates 1104a, 1106a and the positive capacitive plates 1104b, 1106b of the concentric capacitors 1102a, 1102b.

Figure 12:
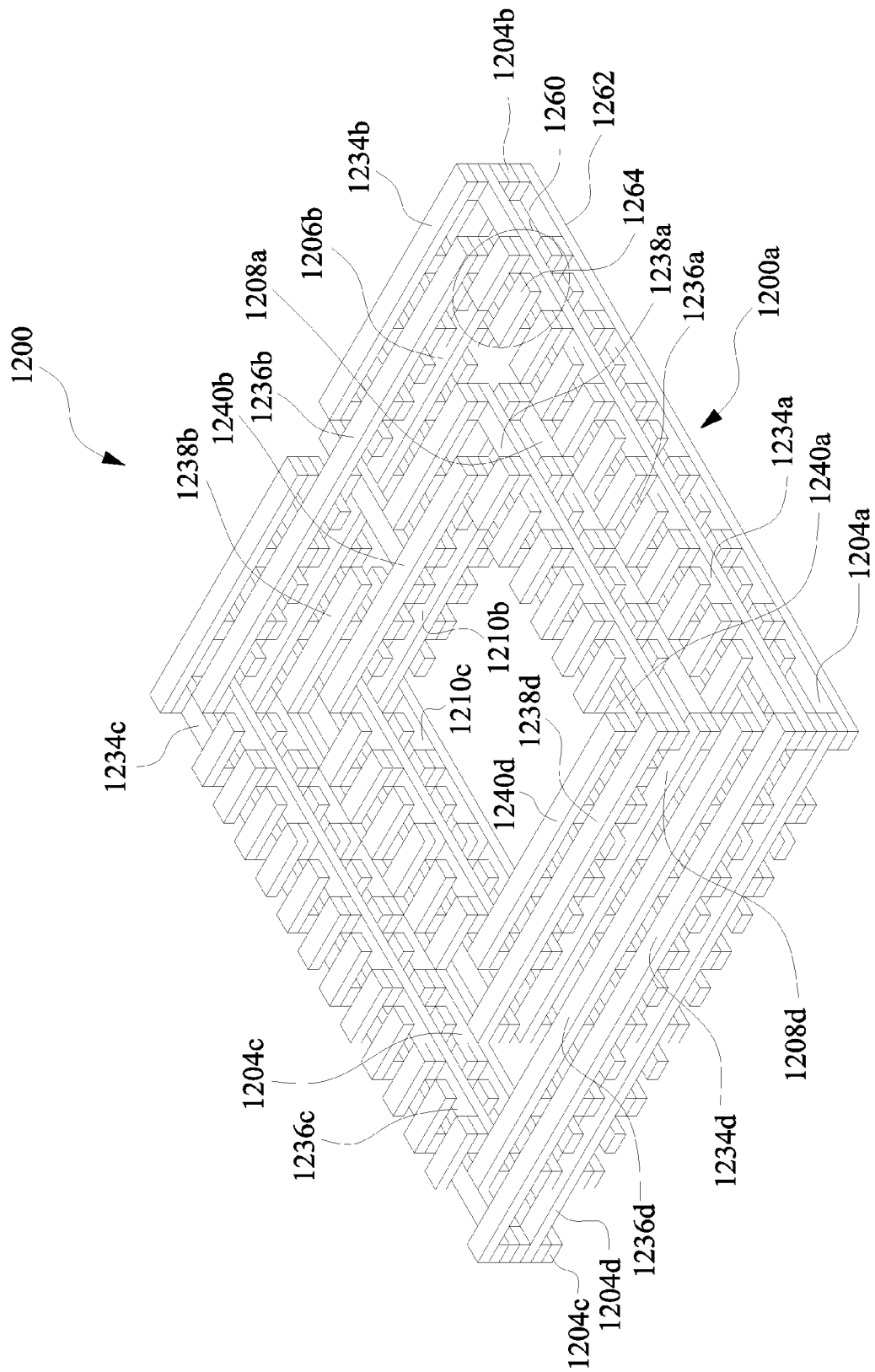
FIG. 12 illustrates a top perspective view of a concentric capacitor structure according to some embodiments of the present disclosure.

FIGS. 12-15 illustrate one embodiment of a concentric capacitive structure 1200. FIG. 12 illustrates a top perspective view of the concentric capacitive structure 1200. The concentric capacitive structure 1200 comprises four routing layers 1202a-1202d (see FIG. 13). Each of the routing layers 1224a-1224d comprise a set of perimeter routing plates and a set of cross-plate routing plates. The perimeter routing plates of the routing layers 1202a-1202d define a plurality of concentric capacitors 1202a, 1202b. Each of the concentric capacitors 1202a, 1202b comprise a first concentric plate 1204, 1208 and a second concentric plate 1206, 1210. Each of the concentric capacitor plates 1204-1210 comprise a first set of perimeter plates 1204a-1210d and a second set of symmetrical perimeter plates 1234a-1240d. The first set of perimeter plates 1204a-1210d are formed in the first and second routing layers 1224a, 1224b and the second set of symmetrical perimeter plates 1234a-1240d are formed in the third and fourth routing layers 1224c, 1224d. In some embodiments, the first concentric plates 1204, 1208 comprise negative capacitive plates, C−, and the second concentric plates 1206, 1210 comprise positive capacitive plates, C+. As used herein, reference numbers 1204-1210, without sub-letters, are used to refer to a complete concentric capacitive plate comprising multiple layers of concentrically arranged perimeter plates (e.g., perimeter plates in all four layers). Reference numbers 1204a-1210d and 1234a-1240d are used to refer to individual plates, formed in a specific routing layer, of each of the concentric capacitive plates that form the complete concentric capacitive plate.

The first set of concentric capacitive plates 1204-1210 each comprise a layer of perimeter plates comprising a first set of perimeter plates 1204a-1210a, 1204c-1210c formed in the first routing layer 1224a and a second set of perimeter plates 1204b-1210b, 1204d-1210d formed in the second routing layer 1224b. The first set of perimeter plates 1204a-1210a, 1204c-1210c and the second set of perimeter plates 1204b-1210b, 1204d-1210d overlap at the edges of the respective plates and are joined by a plurality of interlayer vias 1226a, 1226b to define concentric capacitive plates 1204-1210. The first set of concentric capacitive plates 1204-1210 are similar to the concentric capacitive plates 1104-1110 discussed with respect to FIGS. 11-11C.

A second layer of perimeter plates are symmetrically disposed over the first layer of perimeter plates 1204a-1210d. The second set of perimeter plates comprise a first set of perimeter plates 1234a-1240a, 1234c-1240c formed in the third routing layer 1224c and a second set of perimeter plates 1234b-1240b, 1234d-1240d formed in the fourth routing layer 1224d. The first set of perimeter plates 1234a-1240a, 1234c-1240c and the second set of perimeter plates 1234b-1240b, 1234d-1240d overlap at the edges of the respective plates and are joined by a plurality of interlayer vias 1242, 1242b. The second layer of perimeter plates 1234a-1240d are symmetrically sized and arranged with respect to the first layer of perimeter plates 1204a-1210d. The first layer of perimeter plates 1204a-1210d are coupled to the second layer of perimeter plates 1234a-1240d by a plurality of inter-plate vias 1244 to define concentric capacitive plates 1204-1210.

The concentric capacitive plates 1204-1210 define a capacitive area in a third direction. The number layers having perimeter plates and/or cross-plates may be selected to provide a specific capacitance for each of the concentric capacitors 1202a, 1202b. For example, adding additional routing layers having additional perimeter plates and/or cross-plate routing plates increases the individual capacitance of each of the concentric capacitors 1202a, 1202b without increasing the lateral footprint of the concentric structure 1200. Similarly, having fewer routing layers decreases the capacitance of each of the concentric capacitors 1202a, 1202b.

The first concentric capacitive plates 1204, 1208 may be coupled to a first unidirectional metal 1212 and the second concentric capacitive plates 1206, 1210 may be coupled to a second unidirectional metal 1214. The first concentric capacitive plates 1204, 1208 may comprise positive capacitive plates, C+, and the second concentric capacitive plates 1206, 1210 may comprise negative capacitive plates, C−. It will be recognized that the plurality of the first concentric capacitive plates 1204, 1208 and the second concentric capacitive plates 1206, 1210 may be reversed. In some embodiments, each of the first concentric capacitive plates 1204, 1208 are coupled to one or more switches (not shown) to selectively couple the concentric capacitors 1202a, 1202b to a signal source.

Figure 13:
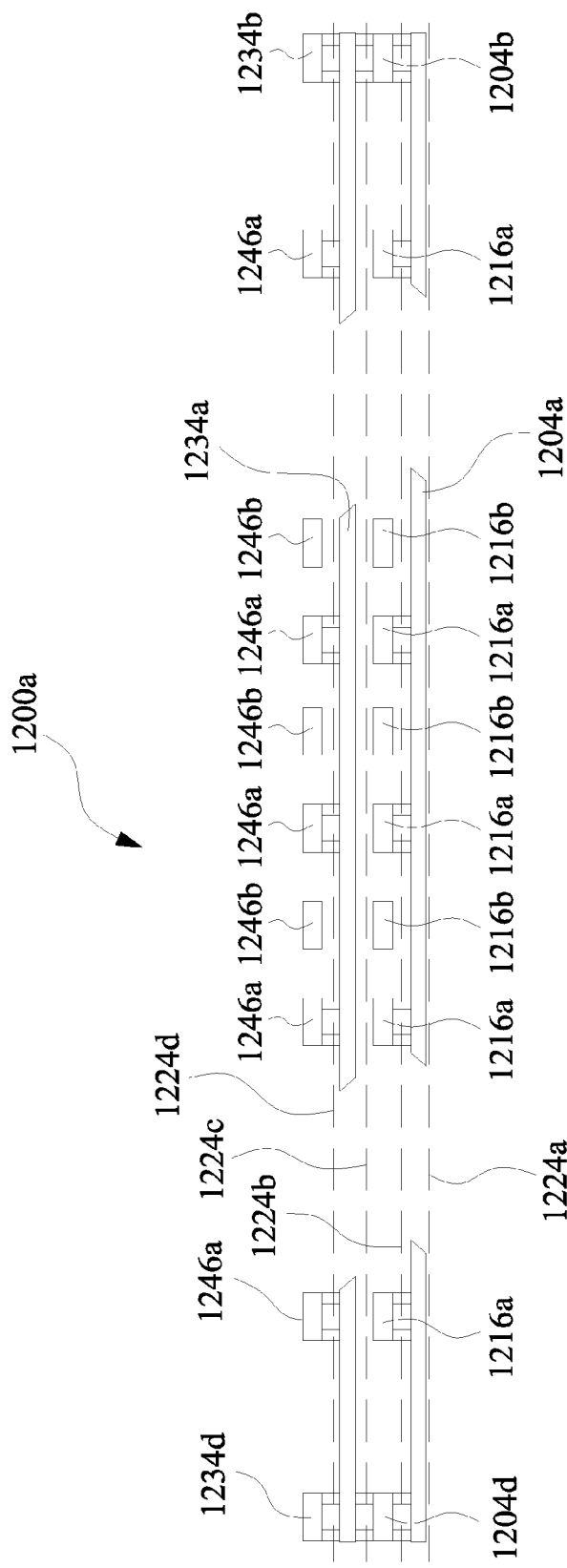
FIG. 13 illustrates a side view of the concentric capacitor structure of FIG. 12.
Figure 14:
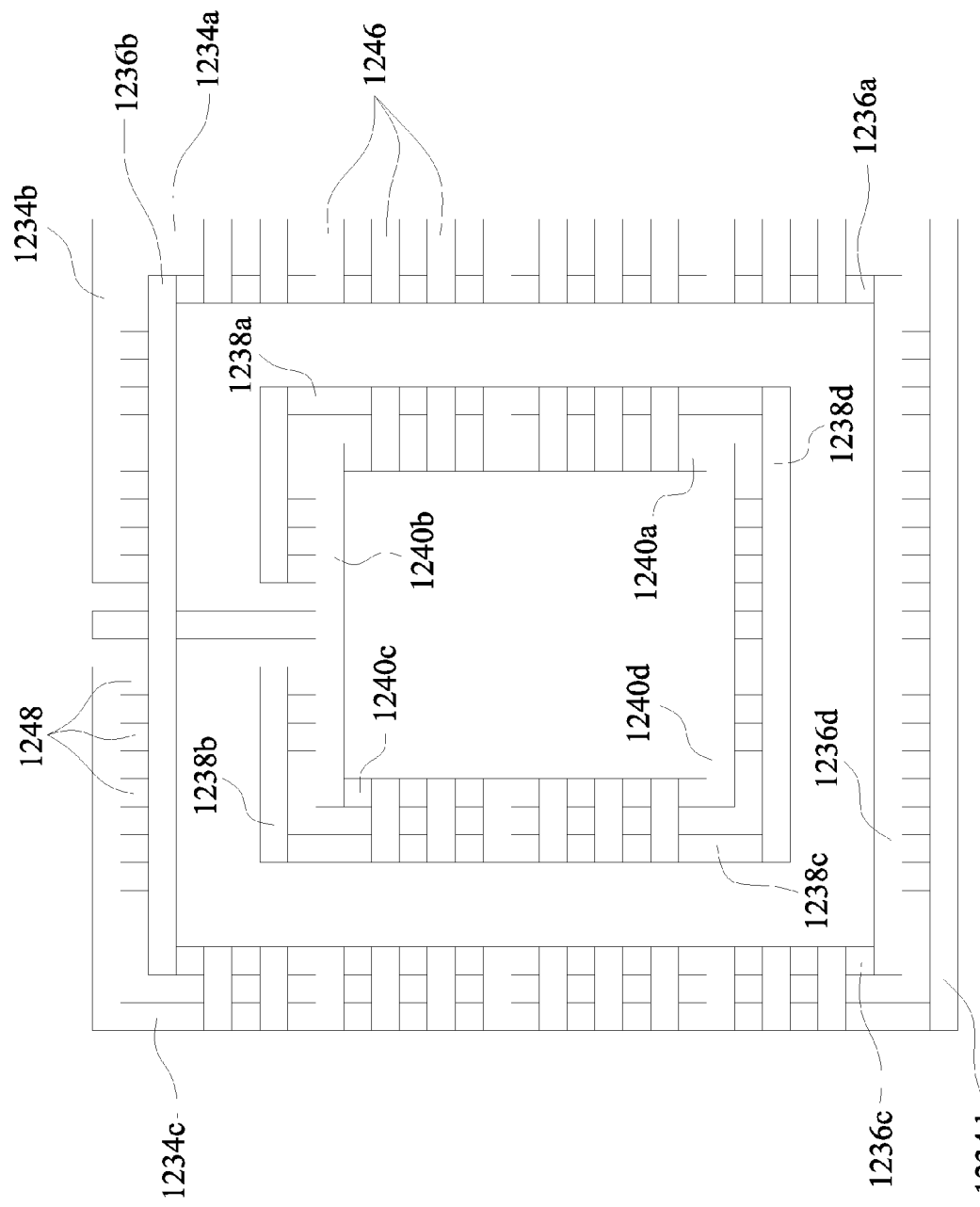
FIG. 14 illustrates a top view of the concentric capacitor structure of FIG. 12.
Figure 15:
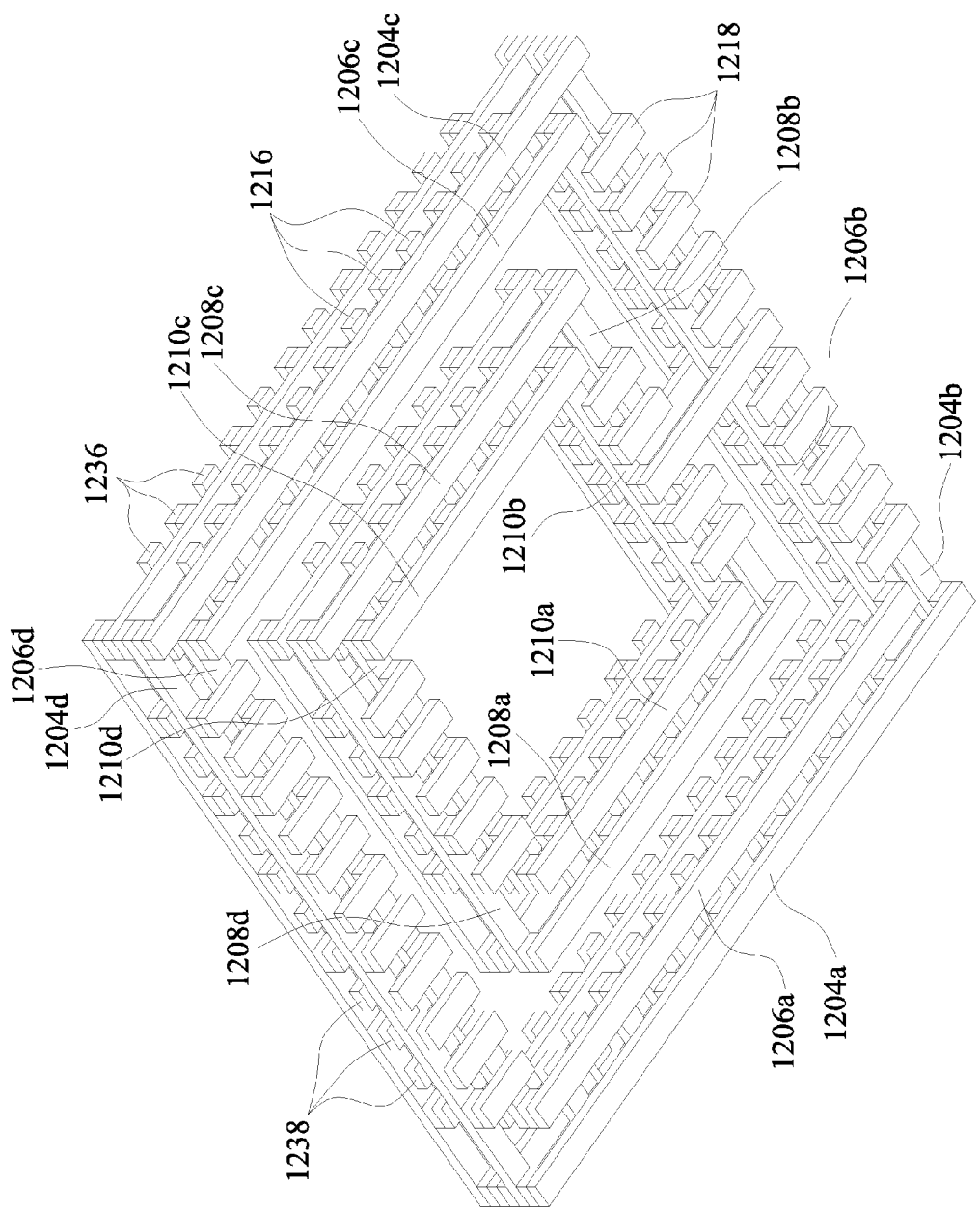
FIG. 15 illustrates a bottom perspective view of the concentric capacitor structure of FIG. 12.

Each of the concentric capacitors 1202a, 1202b comprise a plurality of cross-plate routing plates 1216, 1218, 1246, 1248. The cross-plate routing plates 1216, 1218, 1246, 1258 extend from a first concentric capacitive plate 1204, 1208 to a second concentric capacitive plate 1206, 1210. The cross-plate routing plates 1216, 1218, 1246, 1248 are similar to the cross-plate routing plates 1116-1118 discussed with respect to FIGS. 11-11C. The cross-plate routing plates 1216, 1218, 1246, 1248 are formed in opposite routing layers from routing layer of the overlapping perimeter plates. For example, as illustrated in FIG. 13, a first set of perimeter plates 1204a, 1204c and a second set of perimeter plates 1206a, 1206c are formed in a first routing layer 1224a. A first set of cross-plate routing plates 1216a, 1216b, which overlap the first concentric capacitive plate 1204 and the second concentric capacitive plate 1206, are formed in a second routing layer 1224b. Similarly, a third set of perimeter plates 1234a, 1234c and a fourth set of perimeter plates 1236a, 1236c are formed in a third routing layer 1224c. A second set of cross-plate routing plates 1246a, 1246b, which overlap the first concentric capacitive plate 1204 and the second concentric capacitive plate 1206, are formed in a fourth routing layer 1224d.

The cross-routing plates 1216, 1218, 1246, 1248 extend longitudinally in a direction orthogonal to the longitudinal axis of the overlapping perimeter plates. For example, as shown in FIG. 13, first perimeter plates 1204a, 1234a of the first concentric capacitive plate 1204 are formed in the first routing layer 1224a and the third routing layer 1224c respectively. The first perimeter plates 1204a, 1234a extend longitudinally in a first direction. A plurality over cross-plate routing plates 1216, 1246 are formed in the second routing layer 1224b and the fourth routing layer 1224d respectively. Each of the plurality of cross-plate routing plates 1216, 1246 extend longitudinally in a second direction, orthogonal to the first direction. The cross-plate routing plates 1216, 1246 are coupled to the first perimeter plates 1204a, 1234a by a plurality of vias 1220.

Each of the routing layers 1224a-1224d comprises metal routing plates extending in a single longitudinal direction. For example, the first routing layer 1224a comprises a set of perimeter plates 1204a-1210a, 1204c-1210c and a plurality of cross-plate routing plates 1218. Each of the perimeter plates 1204*a*-1210*a*, 1204*c*-1210*c* and each of the plurality of cross-plate routing plates 1218 extend in a first longitudinal direction. Similarly, the second routing layer 1224*b* comprises a set of perimeter plates 1204*b*-1210*b*, 1204*d*-1210*d* and a plurality of cross-plate routing plates 1216. Each of the perimeter plates 1204*b*-1210*b*, 1204*d*-1210*d* and each of the cross-plate routing plates 1216 extend in a second longitudinal direction. The third routing layer 1224*c* and the fourth routing layer 1224*d* comprise metal routing plates similar to respective first and second routing layers 1224*a*, 1224*b*.

The cross-plate routing plates 1216, 1218, 1246, 1248 increase the capacitance of the concentric capacitive plates 1204-1210. In some embodiments, a first set of the cross-plate routing plates 1216*a*, 1218*a*, 1246*a*, 1248*a* are coupled to the first concentric capacitive plates 1204, 1208 and a second set of the cross-plate routing plates 1216*b*, 1218*b*, 1246*b*, 1248*b* are coupled to the second concentric capacitive plates 1206, 1210. In some embodiments the first concentric capacitive plates 1204, 1208 and the cross-plate routing plates 1216*a*, 1218*a*, 1246*a*, 1248*a* coupled thereto define respective negative capacitive plates, C− plates, of the concentric capacitors 1202*a*, 1202*b* and the second concentric capacitive plates 1206, 1210 and the cross-plate routing plates 1216*b*, 1218*b*, 1246*b*, 1248*b* coupled thereto define respective positive capacitive plates, C+ plates, of the concentric capacitors 1202*a*, 1202*b*. For example, a plate set 1260 illustrates a first cross-plate 1262 and a second cross-plate 1264. The first cross-plate is coupled to the concentric capacitive plate 1204 and the second cross-plate 1264 is coupled to the concentric capacitive plate 1206. When a signal is applied to the concentric capacitor 1202*a*, a capacitive charge develops between the first cross-plate 1262 and the second cross-plate 1264. The capacitive charge developed in the plate set 1260 increases the total capacitance of the concentric capacitor 1202*a*.

The concentric capacitive structure 1200 may be coupled to a switch to selectively couple the concentric capacitors 1224*a*, 1224*b* to a signal source. For example, in some embodiments, the negative concentric capacitive plates 1204, 1208 are coupled to at least one switch. The at least one switch selectively couples the first concentric capacitor 1202*a* and/or the second concentric capacitor 1202*b* to a signal source. When a negative concentric plate of a capacitor, such as, for example, the negative concentric plate 1204 of the first concentric capacitor 1202*a*, is coupled to a signal source, a capacitance is developed between the negative concentric plate 1204 and the positive concentric plate 1206 of the first concentric capacitor 1202*a*. The positive concentric plate 1206 of the first concentric capacitor 1202*a* and the positive concentric plate 1210 of the second concentric capacitor 1202*b* are both coupled to the unidirectional metal 1226. Therefore, some charge will flow to the positive concentric plate 1210 of the second concentric capacitor 1202*b* when the first concentric capacitor 1202*a* is coupled to a signal source (and conversely from the second capacitor 1202*b* to the first capacitor 1202*a* when the second capacitor 1202*b* is energized). However, the gap between the first concentric capacitor 1202*a* and the second concentric capacitor 1202*b* is such that any capacitance developed therebetween can be ignored.

Figure 16:
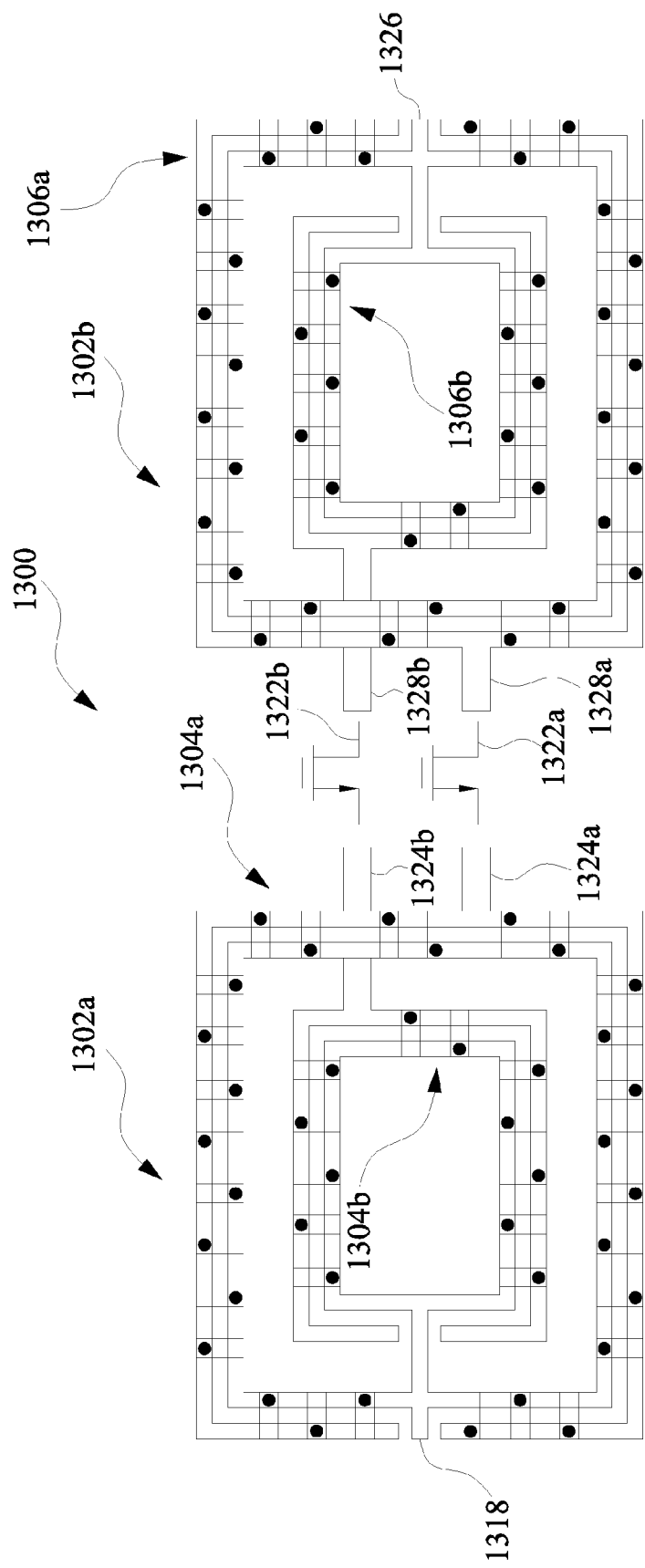
FIG. 16 illustrates a differential capacitive circuit layout according to some embodiments of the present disclosure.

FIG. 16 illustrates a differential capacitive structure 1300 comprising a first concentric capacitor bank 1302*a* and a second concentric capacitor bank 1302*b*. The first concentric capacitor bank 1302*a* comprises a first concentric capacitor 1304*a* and a second concentric capacitor 1304*b*. The second concentric capacitor bank 1302*b* comprises a first concentric capacitor 1306*a* and a second concentric capacitor 1306*b*. Each of the concentric capacitive structures 1304*a*-1306*b* are formed according to the embodiments of concentric capacitors disclosed herein in reference to FIGS. 11-15, and the similar features and construction are not repeated herein.

A first plate of each of the concentric capacitors 1304*a*, 1304*b* of the first capacitor bank 1302*a* are coupled to a first unidirectional metal 1318. A second plate of each of the concentric capacitors 1304*a*, 1304*b* are coupled to switches 1322*a*, 1322*b* by a second unidirectional metal 1324*a*, 1324*b*. A first plate of each of the concentric capacitors 1306*a*, 1306*b* of the second capacitor bank 1302*b* are coupled to a first unidirectional metal 1326. A second plate of each of the concentric capacitors 1306*a*, 1306*b* are coupled to switches 1322*a*, 1322 by a second unidirectional metal 1328*a*, 1328*b*. The switches 1322*a*, 1322*b* are configured to selectively couple each of the concentric capacitors 1304*a*-1306*b* to a signal source (not shown). In some embodiments, the switches 1322*a*, 1322*b* are combined into a single switch, such as, for example, the switch 120 illustrated in FIGS. 2A-2B. The switches 1322*a*, 1322*b* are configured to selectively couple each of the concentric capacitors 1304*a*-1306*b*, or any combination thereof, to a signal source.

In the illustrated embodiment, the first concentric capacitive structure 1302*a* and the second concentric capacitive structure 1302*b* are identical. The resolution of the differential capacitive structure 1300 is determined by the capacitive difference between the first concentric capacitors 1304*a*, 1306*a* and the second concentric capacitors 1304*b*, 1306*b*. In some embodiments, the change in capacitance, $\Delta C$, is equal to $C_{on}-C_{off}$, where $C_{on}$ comprises the concentric capacitors coupled to a signal source and $C_{off}$ comprises the capacitors disconnected from the signal source.

Figure 17:
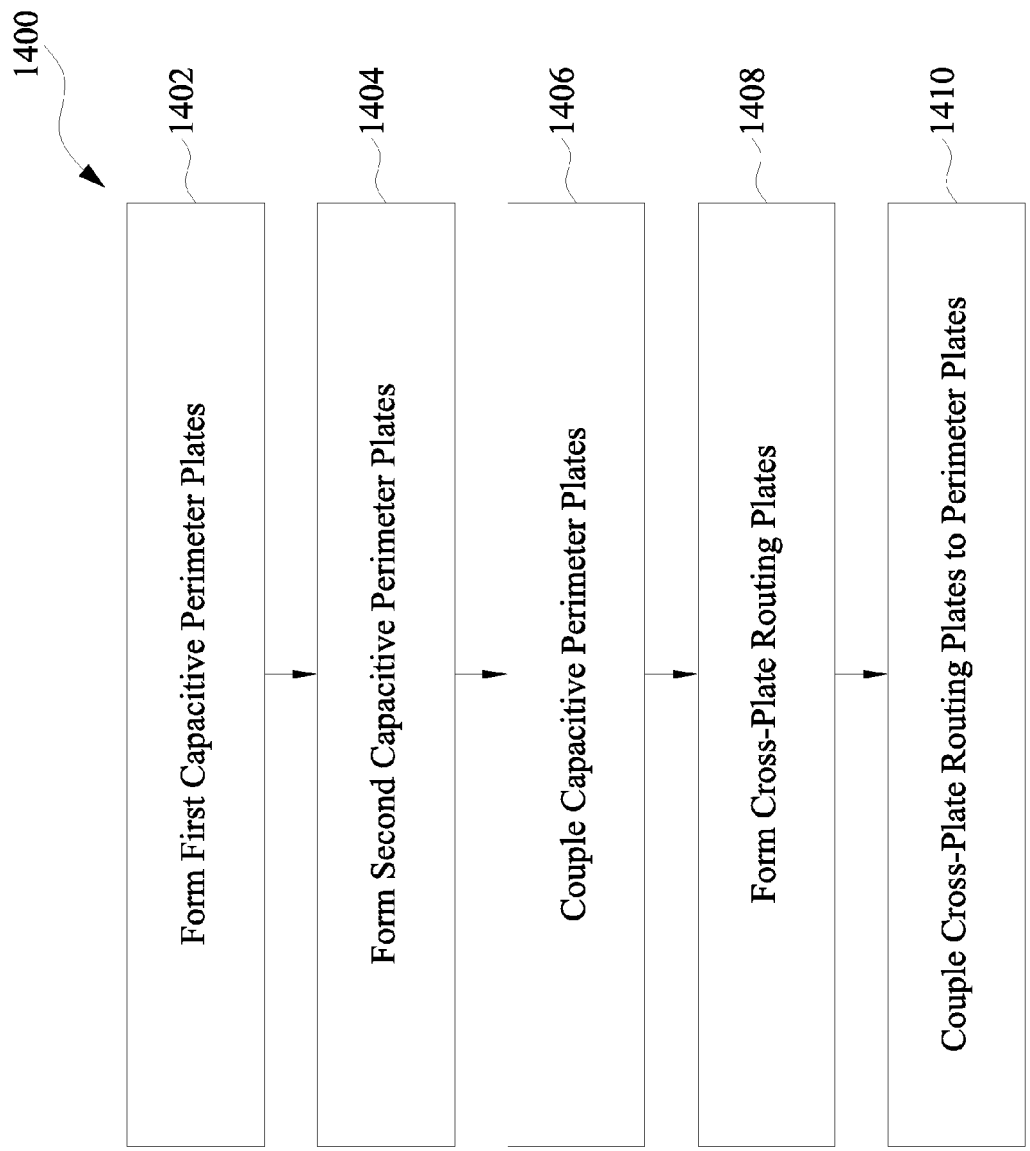
FIG. 17 is a flowchart illustrating one embodiment of a method for forming a concentric capacitor structure.

FIG. 17 is a flowchart illustrating one embodiment of a method 1400 for forming a concentric capacitor structure. In a first step 1402, a first plurality of capacitive perimeter plates is formed on a first routing layer of a semiconductor substrate. The first plurality of capacitive perimeter plates extend longitudinally in a first direction. In a second step 1404, a second plurality of capacitive perimeter plates are formed on a second routing layer of the semiconductor substrate. The second plurality of capacitive perimeter plates extend in a second direction. The second direction may be orthogonal to the first direction. The first plurality and the second plurality of capacitive perimeter plates overlap at the edges of each of the capacitive perimeter plates to form a geometric shape, such as, for example, a square.

In a third step 1406, a first set of the first plurality of capacitive perimeter plates are electrically coupled to a first set of the second plurality of capacitive perimeter plates to form an outer concentric capacitive plate and a second set of the first plurality of capacitive perimeter plates is electrically coupled to a second set of the second plurality of capacitive perimeter to form an inner concentric capacitive plate. The capacitive perimeter plates may be coupled by a plurality of interlayer vias located, for example, at the edges of the perimeter plates.

In a fifth step 1408, a first plurality of capacitive cross-plates is formed on the first routing layer. The first plurality of capacitive cross-plates extend longitudinally in the first direction. The first plurality of capacitive cross plates are positioned such that each of the first plurality of capacitive cross-plates at least partially overlaps the second plurality of capacitive perimeter plates formed on the second routing layer. Each of the first plurality of capacitive cross-plates is electrically to at least one of the second plurality of capacitive perimeter plates. The capacitive cross-plates may be alternatively coupled to the inner and outer concentric capacitive plates. In some embodiments, a second plurality of capacitive cross-plates are formed in the second routing layer. The second plurality of capacitive cross-plates extend longitudinally in the second direction. Each of the second plurality of capacitive cross-plates at least partially overlap the first plurality of capacitive perimeter plates formed in the first routing layer. Each of the second plurality of capacitive cross-plates is electrically to at least one of the first plurality of capacitive perimeter plates. For example, in some embodiments, the capacitive cross-plates are alternatively coupled to the inner and outer concentric capacitive plates. The capacitive cross-plates may be coupled to the perimeter plates by a plurality of interlayer vias.

One of the broader forms of the present disclosure provides a capacitor structure having a semiconductor substrate and a matrix of capacitor units formed over the semiconductor substrate each capacitor unit. Any number of units, 2, 4, 6, 8, and so forth can be included in an exemplary matrix. The matrix includes an interior structure comprised of one or more vertical plates, each vertical plate of the interior structure formed from a plurality of conductive portions connected vertically to each other. Exemplary interior structures can be, but are not limited to, an H-shaped structure, an I-shaped structure, a vertical post, or combinations thereof. The matrix also includes an exterior structure comprised of one or more vertical plates, each vertical plate of the exterior structure formed from a plurality of conductive portions connected vertically to each other, the exterior structure substantially encompassing the interior structure. The exterior structure can be electrically connected to a signal line. In some embodiments, the exterior structures of adjacent capacitor units are electrically connected to each other. The matrix further includes insulative material separating the interior and exterior structures. The capacitor structure also provides a switching mechanism included in the capacitor structure to switch between ones of the plural capacitor units. In various embodiments, each interior structure within the matrix can be electrically connected to a ground node of the switching mechanism. In other embodiments, plural interior structures within the matrix can be connected to different ground nodes of the switching mechanism. Exemplary switching mechanisms can be, but are not limited to, MOSFETs, diodes, BJTs, a PN transistor, an NP transistor, an NPN transistor, a PNP transistor, or combinations thereof. In another embodiment of the present disclosure the capacitor structure can include one or more additional structures, each partially or completely encompassing the matrix of capacitor units. In certain embodiments, adjacent additional structures are alternately electrically connected to signal and ground nodes to thereby change capacitive characteristics of the capacitor structure. In a further embodiment of the present disclosure, the exterior structure further comprises a first set of one or more vertical plates substantially encompassing half of the interior structure, and a second set of one or more vertical plates substantially encompassing an opposing half of the interior structure, each vertical plate of the first and second sets formed from a plurality of conductive portions connected vertically to each other in the respective sets. In this embodiment, the first set is electrically connected to a first signal line, and the second set is electrically connected to a second signal line.

Other broad forms of the present disclosure provide a capacitor structure having a semiconductor substrate and a grid of capacitor elements formed over the semiconductor substrate each capacitor element having a first structure electrically connected to a signal line and a second structure electrically connected to a ground line of a switching mechanism included in the capacitor structure to switch between ones of the capacitor elements in the grid. Any number of elements, 2, 4, 6, 8, and so forth can be included in an exemplary grid. The capacitor structure also includes insulative material separating the first and second structures. In some embodiments, the first structure substantially encompasses one or more second structures. For example, exemplary second structures can be, but are not limited to, an H-shaped structure, an I-shaped structure, a vertical post, or combinations thereof. In additional embodiments, plural second structures within the grid are connected to different ground lines of the switching mechanism. Exemplary switching mechanisms can be, but are not limited to, MOSFETs, diodes, BJTs, a PN transistor, an NP transistor, an NPN transistor, a PNP transistor, or combinations thereof. Another embodiment of the present disclosure further comprises one or more additional structures, each partially or completely encompassing the grid of capacitor elements. One such embodiment includes adjacent additional structures that are alternately electrically connected to signal and ground lines to thereby change the capacitance of the capacitor structure. A further embodiment of the present disclosure provides a first structure having a first set of one or more vertical plates substantially encompassing half of a second structure and a second set of one or more vertical plates substantially encompassing an opposing half of the second structure, each vertical plate of the first and second sets formed from a plurality of conductive portions connected vertically to each other in the respective sets. In this embodiment, the first set is electrically connected to a first signal line, and the second set is electrically connected to a second signal line. In an additional embodiment of the present disclosure, the first structure is a first set of interdigital fingers electrically connected to each other and the second structure is a second set of interdigital fingers electrically connected to each other.

An additional embodiment of the present disclosure provides a method of forming an integrated capacitor structure comprising the steps of providing a semiconductor substrate and forming a grid of capacitor elements over the semiconductor substrate each capacitor element having a first structure electrically connected to a signal line and a second structure electrically connected to a ground line of a switching mechanism included in the capacitor structure to switch between ones of the capacitor elements in the grid. The method also comprises providing insulative material separating the first and second structures.

Other broad forms of the present disclosure provide a concentric capacitor structure. The concentric capacitor structure comprises a semiconductor substrate having a first routing layer and a second routing layer. At least one concentric capacitor is formed on the semiconductor substrate. Each of the at least one concentric capacitors comprise a first plurality of capacitive perimeter plates formed on the first routing layer and a second plurality of capacitive perimeter plates formed on the second routing layer. The first plurality of capacitive perimeter plates extend in a first direction. The second plurality of capacitive perimeter plates extend in a second direction. The second direction is different than the first direction. A first set of the first plurality of capacitive perimeter plates are electrically coupled to a first set of the second plurality capacitive perimeter plates. The first set of the first and second pluralities of capacitive perimeter plates define an outer concentric capacitive plate. A second set of the first plurality of capacitive perimeter plates is electrically coupled to a second set of the second plurality of capacitive perimeter plates. The second set of the first and second pluralities of r capacitive perimeter plates define an inner concentric capacitive plate. A first plurality of capacitive cross-plates are formed on the first routing layer. The first plurality of capacitive cross-plates extend longitudinally in the first direction. Each of the first plurality of capacitive cross-plates overlap at least two of the second plurality of capacitive perimeter plates formed in the second routing layer. Each of the first plurality of capacitive cross-plates are electrically coupled to at least one of the second plurality of capacitive perimeter plates.

Other broad forms of the present disclosure provide a differential capacitive structure. The differential capacitive structure comprises a semiconductor substrate, a first concentric capacitor bank, a second concentric capacitor bank, and a switching mechanism. The semiconductor substrate comprises a first routing layer and a second routing layer. Each of the concentric capacitor banks comprise a first plurality of capacitive perimeter plates formed on the first routing layer and a second plurality of capacitive perimeter plates formed on the second routing layer. The first plurality of capacitive perimeter plates extend in a first direction. The second plurality of capacitive perimeter plates extend in a second direction. The second direction is different than the first direction. A first set of the first plurality of capacitive perimeter plates are electrically coupled to a first set of the second plurality capacitive perimeter plates. The first set of the first and second pluralities of capacitive perimeter plates define an outer concentric capacitive plate. A second set of the first plurality of capacitive perimeter plates are electrically coupled to a second set of the second plurality of capacitive perimeter plates. The second set of the first and second pluralities of capacitive perimeter plates define an inner concentric capacitive plate. A first plurality of capacitive cross-plates are formed on the first routing layer. The first plurality of capacitive cross-plates extend longitudinally in the first direction. Each of the first plurality of capacitive cross-plates overlap at least two of the second plurality of capacitive perimeter plates formed in the second routing layer. Each of the first plurality of capacitive cross-plates are electrically coupled to at least one of the second plurality of capacitive perimeter plates. The switching mechanism is configured to selectively couple the outer concentric capacitive plates to a signal source.

An additional embodiment of the present disclosure provides a method for forming a concentric capacitor structure. The method comprises the steps of forming a first plurality of capacitive perimeter plates on a first routing layer of a semiconductor substrate; forming a second plurality of capacitive perimeter plates on a second routing layer of the semiconductor substrate; electrically coupling a first set of the first plurality of capacitive perimeter plates to a first set of the second plurality of capacitive perimeter plates to form a plurality of outer concentric capacitive plates; electrically coupling a second set of the first plurality of capacitive perimeter plates to a second set of the second plurality of capacitive perimeter plates to form a plurality of inner concentric capacitive plates; forming a first plurality of capacitive cross-plates on the first routing layer; and electrically coupling each of the first plurality of capacitive cross-plates to at least one of the second plurality of capacitive perimeter plates. The first plurality of capacitive cross-plates extend longitudinally in the first direction. Each of the first plurality of capacitive cross-plates at least partially overlap the second plurality of capacitive perimeter plates formed on the second routing layer. The first plurality of capacitive perimeter plates extend in a first direction and the second plurality of capacitive perimeter plates extend in a second direction. The first direction is different than the second direction.

Embodiments of the present disclosure thus described provide higher Q values than conventional capacitor elements, provide for no local variation due to a lack of process variation within the same capacitor structure when switching, and provide tunable or compensable capacitances for a respective capacitor. Additionally, exemplary embodiments can provide varying parasitic capacitances for diodes when the biasing is changed, e.g., if the diode is forward biased then no parasitic capacitance is provided.

Embodiments of the present disclosure thus described provide an enhanced capacitance density compared to traditional concentric capacitor structures without increasing the layout area. Additionally, exemplary embodiments provide coherent variation between concentric capacitor plates defined by the concentric orthogonal metal routing plates and do not impact unidirectional, one-dimensional BEOL processes used for manufacture of semiconductor structures.

It can be emphasized that the above-described embodiments, particularly any "preferred" embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

As shown by the various configurations and embodiments illustrated in FIGS. 1-16, various switched capacitor structures have been described.

While preferred embodiments of the present disclosure have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:
1. A structure comprising:
a semiconductor substrate comprising a first routing layer, a second routing layer, a third routing layer and a fourth routing layer;
at least one concentric capacitor formed on the semiconductor substrate, wherein each of the at least one concentric capacitors comprises:
a first plurality of capacitive perimeter plates formed in the first routing layer and a third plurality of capacitive perimeter plates formed in the third routing layer, the first plurality of capacitive perimeter plates and the third plurality of capacitive perimeter plates extending in a first direction;

a second plurality of capacitive perimeter plates formed in the second routing layer and a fourth plurality of capacitive perimeter plates formed in the fourth routing layer, the second plurality of capacitive perimeter plates and the fourth plurality of capacitive perimeter plates extending in a second direction, wherein the second direction is different than the first direction, wherein a first set of the first plurality of capacitive perimeter plates is electrically coupled to a first set of the second plurality of capacitive perimeter plates to define an outer concentric capacitive plate, and wherein a second set of the first plurality of capacitive perimeter plates is electrically coupled to a second set of the second plurality of capacitive perimeter plates to define an inner concentric capacitive plate;

a first plurality of capacitive cross-plates formed in the first routing layer, the first plurality of capacitive cross-plates extending longitudinally in the first direction, wherein each of the first plurality of capacitive cross-plates at least partially overlaps the second plurality of capacitive perimeter plates formed in the second routing layer, and wherein each of the first plurality of capacitive cross-plates are electrically coupled to at least one of the second plurality of capacitive perimeter plates by a first set of inter-layer vias, thereby increasing a capacitance of the at least one concentric capacitor; and a switching mechanism configured to selectively couple one of the outer concentric capacitive plate or the inner concentric capacitive plate to a signal source.

2. The structure of claim 1, comprising a second plurality of capacitive cross-plates formed in the second routing layer, the second plurality of capacitive cross-plates extending longitudinally in the second direction, wherein each of the second plurality of capacitive cross-plates at least partially overlaps the first plurality of capacitive perimeter plates formed in the first routing layer, and wherein each of the second plurality of capacitive cross-plates are electrically coupled to at least one of the first plurality of capacitive perimeter plates by a second set of inter-layer vias, thereby increasing the capacitance of the at least one concentric capacitor.

3. The structure of claim 2, wherein the third plurality of capacitive perimeter plates located symmetrically with respect to the first plurality of capacitive perimeter plates, wherein a first set of the third plurality of capacitive perimeter plates are electrically coupled to the outer concentric capacitive plate, and wherein a second set of the third plurality of capacitive perimeter plates are electrically coupled to the inner concentric capacitive plate.

4. The structure of claim 3, further comprising a third plurality of capacitive cross-plates formed in the third routing layer, the third plurality of capacitive cross-plates extending longitudinally in the first direction, wherein each of the third plurality of capacitive cross-plates at least partially overlaps the second plurality of capacitive perimeter plates formed in the second routing layer, and wherein each of the third plurality of capacitive cross-plates are electrically coupled to at least one of the second plurality of capacitive perimeter plates by a third set of inter-layer vias, thereby increasing the capacitance of the at least one concentric capacitor.

5. The structure of claim 4, wherein the fourth plurality of capacitive perimeter plates located symmetrically with respect to the second plurality of capacitive perimeter plates, wherein a first set of the fourth plurality of capacitive perimeter plates is electrically coupled to the outer concentric capacitive plates and a second set of the fourth plurality of capacitive perimeter plates is electrically coupled to the inner concentric capacitive plates.

6. The structure of claim 5, further comprising a fourth plurality of capacitive cross-plates formed in the fourth routing layer, the fourth plurality of capacitive cross-plates extending longitudinally in the second direction, wherein each of the fourth plurality of capacitive cross-plates at least partially overlaps the first and third pluralities of capacitive perimeter plates, and wherein each of the fourth plurality of capacitive cross-plates are electrically coupled to at least one of the third plurality of capacitive perimeter plates by a fourth set of inter-layer vias, thereby increasing the capacitance of the at least one concentric capacitor.

7. The structure of claim 1, wherein the switching mechanism is selected from the group consisting of metal-oxide-semiconductor field effect transistor (MOSFET), a diode, a bipolar junction transistor (BJT), a PN transistor, an NP transistor, an NPN transistor, a PNP transistor, or combinations thereof.

8. A differential capacitive structure, comprising:
a semiconductor substrate comprising a first routing layer and a second routing layer;
a first concentric capacitor bank and a second concentric capacitor bank formed on the semiconductor substrate, each of the concentric capacitor banks comprising:
at least two concentric capacitors formed on the semiconductor substrate, wherein each of the concentric capacitors comprises:
a first plurality of capacitive perimeter plates formed in the first routing layer, the first plurality of capacitive perimeter plates extending in a first direction;
a second plurality of capacitive perimeter plates formed in the second routing layer, the second plurality of capacitive perimeter plates extending in a second direction, wherein the second direction is different than the first direction, wherein a first set of the first plurality of capacitive perimeter plates is electrically coupled to a first set of the second plurality of capacitive perimeter plates to define an outer concentric capacitive plate, and wherein a second set of the first plurality of capacitive perimeter plates is electrically coupled to a second set of the second plurality of capacitive perimeter plates to define an inner concentric capacitive plate; and
a first plurality of capacitive cross-plates formed in the first routing layer, the first plurality of capacitive cross-plates extending longitudinally in the first direction, wherein each of the first plurality of capacitive cross-plates at least partially overlaps the second plurality of capacitive perimeter plates formed in the second routing layer, and wherein each of the first plurality of capacitive cross-plates are electrically coupled to at least one of the second plurality of capacitive perimeter plates, thereby increasing a capacitance of at least one of the outer and inner concentric capacitive plates; and
a switching mechanism configured to selectively couple at least one of the concentric capacitors to a signal source.

9. The differential capacitive structure of claim 8, wherein each of the concentric capacitor banks comprises a second plurality of capacitive cross-plates formed in the second routing layer, the second plurality of capacitive cross-plates extending longitudinally in the second direction, wherein each of the second plurality of capacitive cross-plates at least partially overlaps the first plurality of capacitive perimeter plates formed in the first routing layer, and wherein each of the second plurality of capacitive cross-plates are electrically coupled to at least one of the first plurality of capacitive perimeter plates, thereby increasing the capacitance of at least one of the concentric capacitors.

10. The differential capacitive structure of claim 9, wherein the semiconductor substrate comprises a third routing layer, the structure further comprising a third plurality of capacitive perimeter plates formed on the third routing layer, the third plurality of capacitive perimeter plates extending in the first direction and located symmetrically with respect to the first plurality of capacitive perimeter plates, wherein a first set of the third plurality of capacitive perimeter plates is electrically coupled to the outer concentric capacitive plate, and wherein a second set of the third plurality of capacitive perimeter plates is electrically coupled to the inner concentric capacitive plate.

11. The structure of claim 10, further comprising a third plurality of capacitive cross-plates formed on the third routing layer, the third plurality of capacitive cross-plates extending longitudinally in the first direction, wherein each of the third plurality of capacitive cross-plates at least partially overlaps the second plurality of capacitive perimeter plates formed in the second routing layer, and wherein each of the third plurality of capacitive cross-plates are electrically coupled to at least one of the second plurality of capacitive perimeter plates, thereby increasing the capacitance of at least one the concentric capacitors.

12. The structure of claim 11, wherein the semiconductor substrate comprises a fourth routing layer, the structure further comprising a fourth plurality of capacitive perimeter plates formed on the fourth routing layer, the fourth plurality of capacitive perimeter plates extending in the second direction and located symmetrically with respect to the second plurality of capacitive perimeter plates, wherein a first set of the fourth plurality of capacitive perimeter plates is electrically coupled to the outer concentric capacitive plates and a second set of the fourth plurality of capacitive perimeter plates is electrically coupled to the inner concentric capacitive plates.

13. The differential capacitive structure of claim 8, wherein the switching mechanism is selected from the group consisting of a metal-oxide-semiconductor field effect transistor (MOSFET), a diode, a bipolar junction transistor (BJT), a PN transistor, an NP transistor, an NPN transistor, a PNP transistor, or combinations thereof.

* * * * *